(12) United States Patent
Yoshii et al.

(10) Patent No.: US 7,191,296 B2
(45) Date of Patent: Mar. 13, 2007

(54) DATA WRITING APPARATUS, DATA WRITING METHOD, AND PROGRAM

(75) Inventors: Takeo Yoshii, Yokohama (JP); Masahiko Shimizu, Yokohama (JP)

(73) Assignee: Tokyo Electron Device Limited, Kanagawa (JP)

( * ) Notice: Subject to any disclaimer, the term of this patent is extended or adjusted under 35 U.S.C. 154(b) by 342 days.

(21) Appl. No.: 10/476,475

(22) PCT Filed: Sep. 27, 2002

(86) PCT No.: PCT/JP02/10064

§ 371 (c)(1),
(2), (4) Date: Oct. 31, 2003

(87) PCT Pub. No.: WO03/030181

PCT Pub. Date: Apr. 10, 2003

(65) Prior Publication Data

US 2004/0172576 A1 Sep. 2, 2004

(30) Foreign Application Priority Data

Sep. 28, 2001 (JP) ............................... 2001-301789

(51) Int. Cl.
*G06F 13/00* (2006.01)
(52) U.S. Cl. ............................ 711/154; 711/2; 711/168
(58) Field of Classification Search ................ 711/154, 711/168
See application file for complete search history.

(56) References Cited

U.S. PATENT DOCUMENTS 5,369,754 A * 11/1994 Fandrich et al. ............ 711/103
6,528,843 B1 * 3/2003 Wu ............................ 257/315

FOREIGN PATENT DOCUMENTS

| EP | 1100091 A1 | 5/2001 |
| JP | 2000-011677 | 1/2000 |
| JP | 2000-066949 | 3/2000 |
| JP | 2000-276367 A | 10/2000 |
| JP | 2000-330876 A | 11/2000 |
| JP | 2001-154863 | 6/2001 |
| JP | 2001-265665 | 9/2001 |

* cited by examiner

*Primary Examiner*—Reba I. Elmore
(74) *Attorney, Agent, or Firm*—Mitchell P. Brook; Luce, Forward, Hamilton & Scripps LLP

(57) ABSTRACT

Each of a plurality of storage devices (N–1 to N-n) has a plurality of memory blocks for storing data. A data writing apparatus obtains error information which represents good blocks which can store data correctly, from the plurality of storage devices (N–1 to N-n). The data writing apparatus determines a memory block in which data is to be written, in each of the plurality of storage devices (N–1 to N-n), based on the obtained error information. The data writing apparatus controls the plurality of storage devices (N–1 to N-n), and writes predetermined data in the determined memory blocks.

12 Claims, 16 Drawing Sheets

DATA WRITING APPARATUS, DATA WRITING METHOD, AND PROGRAM

TECHNICAL FIELD

The present invention relates to an apparatus, a method, and a program for writing data in a storage device. Particularly, the present invention relates to an apparatus, a method and a program for writing same data into a plurality of storage devices.

BACKGROUND ART

Flash memories known as small-sized storage devices are roughly classified into NOR type, NAND type, and AND type.

NOR type flash memories can be randomly accessed on a basis of one byte unit. However, when compared to NAND type and AND type flash memories, NOR type flash memories are expensive and have low integrated density.

On the other hand, since NAND type and AND type flash memories are low-cost and have high integrated density when compared to NOR type flash memories, those flash memories are widely used. For example, TH58512FT (TOSHIBA) is known as one of AND type flash memories.

However, the ratios of defective memory blocks (memory blocks which cannot store data correctly) included in all the memory blocks constituting the memory areas of the NAND type and AND type flash memories are intolerably large.

Accordingly, in many cases, when addressing a plurality of NAND type (or AND type) flash memories in parallel to write same data, writing cannot be correctly performed.

Therefore, in order to write same data in a plurality of NAND type (or AND type) flash memories, data is written in the plurality of NAND type (or AND type) flash memories one by one in a sequential order, using a control signal such as a chip enable signal.

However, the above method is inefficient, and if NAND type (or AND type) flash memories in which data is to be written are existing in a large number, quite a long time is required to complete writing.

Therefore, it has been quite difficult to mass produce products including NAND type (or AND type) flash memories in which predetermined data is preinstalled.

DISCLOSURE OF INVENTION

Accordingly, an object of the present invention is to provide a data writing apparatus, a data writing method, and a program for writing same data efficiently in a plurality of storage devices which might have defective memory blocks.

To achieve the above object, a data writing apparatus according to a first aspect of the present invention is a data writing apparatus for writing same data in a plurality of storage devices, wherein each of the plurality of storage devices (N-1 to N-n) comprises:
  a plurality of memory blocks which store data and error information representing whether or not each of said plurality of memory blocks is a good block which can store data correctly;
  an error information supplier (22, 34, 35) which supplies the data writing apparatus with the error information stored in the plurality of memory blocks; and
  a data writer (22, 34, 35) which, in response to an instruction of the data writing apparatus, writes data in a memory block designated by the data writing apparatus, and the data writing apparatus comprises:
  a block designator (12) which designates a memory block to which data is to be written for each of the plurality of storage devices (N-1 to N-n), based on the error information supplied from the error information supplier (22, 34, 35);
  a data supplier (12) which supplies the plurality of storage devices (N-1 to N-n) with data to be written; and
  a writing instructor (12) which instructs the plurality of storage devices (N-1 to N-n) to write the data supplied by the data supplier (12) in the memory blocks designated by the block designator (12).

According to this invention, since a memory block in which data is to be written is designated based on error information, it is possible to write same data efficiently in a plurality of storage devices which might have defective memory blocks.

Each of the plurality of storage devices (N-1 to N-n) may further comprise:
  a first determiner (22, 34, 35) which determines whether or not the data has been written correctly; and
  a result supplier (22, 34, 35) which supplies the data writing apparatus with a determination result of the first determiner (22, 34, 35).

The data writing apparatus may further comprise:
  a second determiner (12) which determines whether or not there is any defective device among the plurality of storage devices (N-1 to N-n) to which the data has not been written correctly, based on the determination result supplied form the result supplier (22, 34, 35); and
  a defective device identifier (12) which in a case where the second determiner (12) determines that there is any defective device, identifies the defective device.

The block designator (12) may designate another memory block to which the data is to be written, in the defective device identified by the defective device identifier (12) based on the error information.

The writing instructor (12) may instruct the defective device to write the data supplied by the data supplier (12) in the another memory block designated by the block designator 12).

The block designator (12) may comprise:
  a table generator (12) which generates a good block table listing good blocks included in each of the plurality of storage devices (N-1 to N-n), based on the error information supplied from the error information supplier (22, 34, 35); and
  a block determiner (12) which determines a memory block to which the data is to be written, based on the good block table.

The data writing apparatus may further comprise an information updating unit (12) which, in a case where the second determiner (12) determines that there is any defective device, updates the error information stored in the plurality of memory blocks included in the defective device.

The data writing apparatus may further comprise:
  a third determiner (12) which determines whether or not there is any storage device which has no memory block left in which data can be written; and a suspension unit (12) which suspends data writing, in a case where the third determiner (12) determines that there is any storage device which has no memory block left in which data can be written.

Each of the plurality of memory blocks may be allotted an address.

The block designator (12) may designate a memory block to which data is to be written, by outputting an address allotted to the memory block to which data is to be written.

The block designator (12) may divides the address into a plurality of parts, and outputs the plurality of parts one by one.

In a case where at least a part of the address to be output is common to at least two of the plurality of storage devices (N-1 to N-n), the block designator (12) may output the common part of the address to the at least two storage devices simultaneously.

Each of the plurality of storage devices (N-1 to N-n) may be constituted by a NAND type flash memory.

Each of the plurality of storage devices (N-1 to N-n) may be constituted by an AND type flash memory.

A data writing method according to a second aspect of the present invention is a data writing method of writing same data in a plurality of storage devices, wherein each of the plurality of storage devices (N-1 to N-n) comprises:
 a plurality of memory blocks which store data and error information representing whether or not each of the plurality of memory blocks is a good block which can store data correctly; and
 a data writer (22, 34, 35) which writes data in said plurality of memory blocks, and
the data writing method comprises:
a block designating step of designating a memory block in which data is to be written for each of the plurality of storage devices (N-1 to N-n), based on the error information stored in said plurality of memory blocks;
a data supplying step of supplying the plurality of storage devices (N-1 to N-n) with data to be written; and
a writing step of instructing the plurality of storage devices (N-1 to N-n) to write the data supplied in the data supplying step in the memory block designated in the block designating step.

A program according to a third aspect of the present invention controls a computer to function as a data writing apparatus which writes same data in a plurality of storage devices (N-1 to N-n) each comprising: a plurality of memory blocks which store data and error information representing whether or not each of said plurality of memory blocks is a good block which can store data correctly; an error information supplier (22, 34, 35) which supplies the error information stored in the plurality of memory blocks; and a data writer (22, 34, 35) which writes data in the plurality of memory blocks, the data writing apparatus comprising:
 a block determiner (12) which determines a memory block to which data is to be written for each of the plurality of storage devices (N-1 to N-n), based on the error information supplied from the error information supplier (22, 34, 35);
 a data supplier (12) which supplies the plurality of storage devices (N-1 to N-n) with data to be written; and
 a writer (12) which, by controlling each of the plurality of storage devices (N-1 to N-n), writes the data supplied by the data supplier (12) in the memory block determined by the block determiner (12).

BRIEF DESCRIPTION OF THE DRAWINGS

These objects and other objects and advantages of the present invention will become more apparent upon reading of the following detailed description and the accompanying drawings in which.

BEST MODE FOR CARRYING OUT THE INVENTION

Next, a data writing apparatus and a data writing method according to embodiments of the present invention will be explained, by employing a flash memory writing apparatus as an example.

First Embodiment

Figure 1:
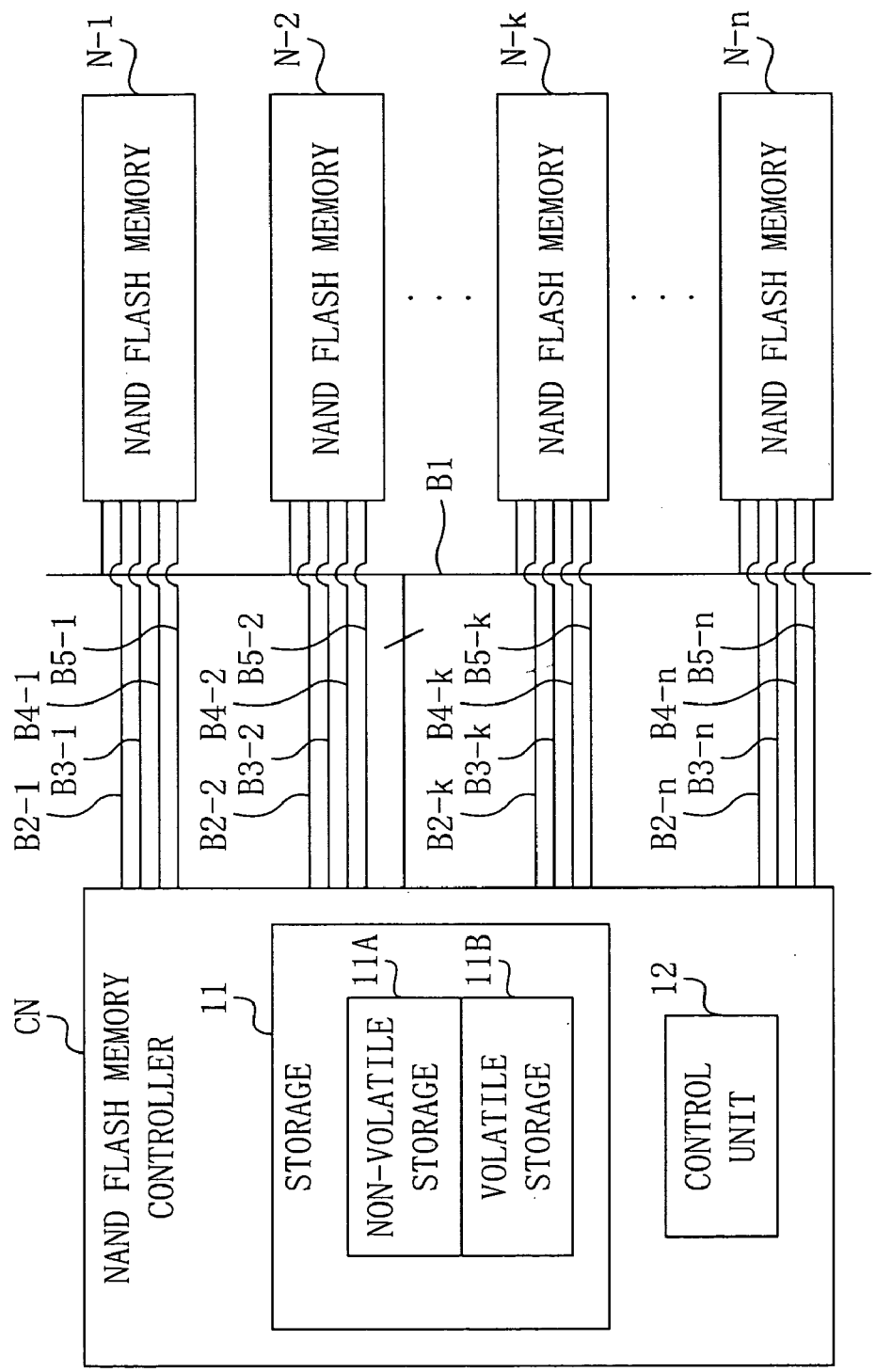
FIG. 1 is a diagram showing a structure of a flash memory writing apparatus according to a first embodiment.

A flash memory writing apparatus according to a fist embodiment has a structure shown in FIG. 1, and writes same data in a n (n is an integer equal to or greater than 2) number of NAND flash memories N-1 to N-n.

As shown in FIG. 1, the flash memory writing apparatus according the first embodiment comprises a NAND flash memory controller (memory controller) CN, a bus B1, address latch enable (ALE) signal lines B2-1 to B2-n, command latch enable (CLE) signal lines B3-1 to B3-n, read enable (RE) signal lines B4-1 to B4-n, and ready signal lines B5-1 to B5-n.

The memory controller CN is connected to the NAND flash memories N-1 to N-n equally through the bus B1. The bus B1 is constituted by a data/address bus having a bit width of plural bits, and a write enable (WE) signal line.

Further, the memory controller CN is connected to the NAND flash memories N-1 to N-n separately through the ALE signal lines B2-1 to B2-n, the CLE signal lines B3-1 to B3-n, the RE signal lines B4-1 to B4-n, and the ready signal lines B5-1 to B5-n.

Specifically, the memory controller CN is connected to the NAND flash memory N-k (k is an arbitrary integer equal to or greater than 1 and equal to or smaller than n) through the ALE signal line B2-k, the CLE signal line B3-k, the RE signal line B4-k, and the ready signal line B5-k.

As shown in FIG. 1, the memory controller CN comprises a storage 11, and a control unit 12, and performs writing, reading, and erasing of data on the NAND flash memories N-1 to N-n.

The storage 11 comprises a non-volatile storage 11A such as PROM (programmable Read Only Memory) or the like, and a volatile storage 11B such as RAM (Random Access Memory) or the like.

The non-volatile storage 11A pre-stores a program for controlling the operation of the control unit 12. The volatile storage 11B is used as the work area of the control unit 12.

The control unit 12 is constituted by a CPU (Central Processing Unit) or the like, and operates in accordance with the program stored in the storage 11.

The control unit 12 receives ready signals supplied from the NAND flash memories N-1 to N-n through the ready signal lines B5-1 to B5-n. The ready signals represent the states of operation of the NAND flash memories N-1 to N-n.

The control unit 12 controls the operation of the respective flash memories N-1 to N-n based on the states of operation represented by the supplied ready signals.

Specifically, the control unit 12 outputs a command, data, and an address to the NAND flash memories N-1 to N-n equally through the data/address bus of the bus B1. The command is for instructing the NAND flash memories N-1 to N-n to write, read, and erase data. The data is the object to be written in the NAND flash memories N-1 to N-n. The address represents a location to write in data, a storage location of data to be read, or a storage location of data to be erased, as will be described later.

The control unit 12 outputs a WE signal to the NAND flash memories N-1 to N-n equally through the WE signal line of the bus B1. The control unit 12 outputs an ALE signal through the ALE signal lines B2-1 to B2-n, a CLE signal through the CLE signal lines B3-1 to B3-n, and a RE signal through the RE signal lines B4-1 to B4-n to the NAND flash memories N-1 to N-n separately.

As will be described later, the WE signal, the ALE signal, the RE signal, and the CLE signal are combined together thereby to instruct latch timings (timings to obtain) of the above described command, data, and address to the NAND flash memories N-1 to N-n.

Next, the structure of the NAND flash memories N-1 to N-n will be explained.

Each of the NAND flash memories N-1 to N-n is constituted by a NAND type EEPROM (Electrically Erasable/Programmable ROM).

Figure 2:
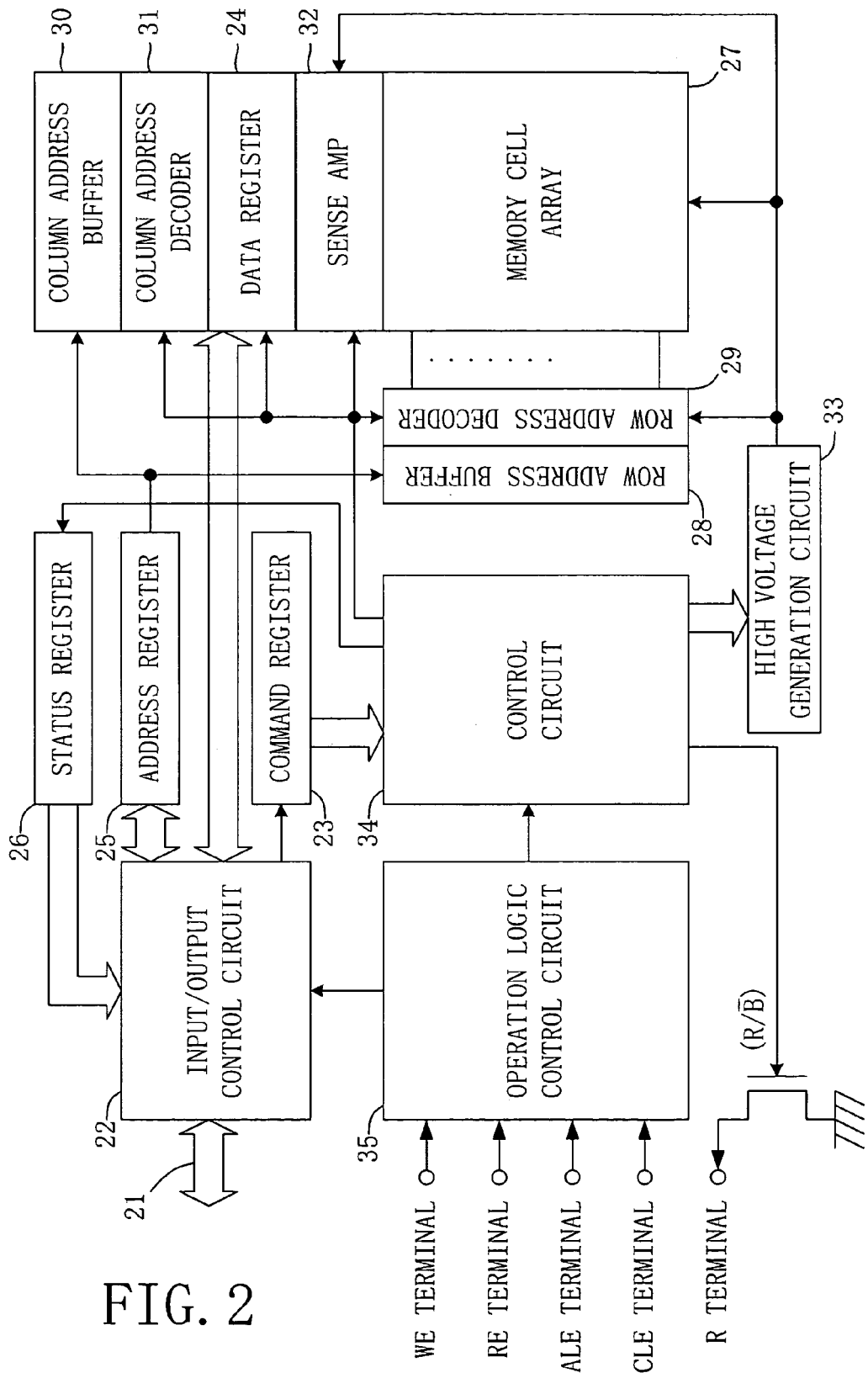
FIG. 2 is a diagram showing a structure of a NAND flash memory shown in FIG. 1.

FIG. 2 is a block diagram of a NAND flash memory N-k (k is an arbitrary integer equal to or greater than 1, and equal to or smaller than n).

As shown in FIG. 2, the NAND flash memory N-k comprises a data/address bus 21, input/output control circuit 22, a command register 23, a data register 24, an address register 25, a status register 26, a memory cell array 27, a row address buffer 28, a row address decoder 29, a column address buffer 30, a column address decoder 31, a sense amp 32, a high voltage generation circuit 33, a control circuit 34, and an operation logic control circuit 35.

The data/address bus 21 is connected to the data/address bus of the bus B1.

The input/output control circuit 22 is connected to the memory controller CN through the data/address bus 21. The input/output control circuit 22 receives a command, data, and an address to be supplied from the memory controller CN. Also, the input/output control circuit 22 outputs data read from the memory cell array 27, a later-described operation result to be stored in the status register 26, etc. to the memory controller CN.

The command register 23 stores a command received by the input/output control circuit 22.

The data register 24 stores data received by the input/output control circuit 22, and data read from the memory cell array 27.

The address register 25 stores an address received by the input/output control circuit 22.

The status register 26 stores results of operations executed under the control of the memory controller CN.

The memory cell array 27 is formed of a plurality of memory cells arranged in a matrix, and stores various data. The detailed structure of the memory cell array 27 will be described later.

The row address buffer 28, the row address decoder 29, the column address buffer 30, and the column address decoder 31 convert an address stored in the address register 25 into a row and column for specifying the location of a memory cell to or from which data is written, read, or erased. Then, the row address buffer 28, the row address decoder 29, the column address buffer 30, and the column address decoder 31 select the memory cell located in the converted row and column. By this selection, data is written in, read from, or erased from the selected memory cell.

The sense amp 32 amplifies a signal representing data read from the memory cell array 27 by a predetermined amplification rate, and stores the data in the data register 24.

The high voltage generation circuit 33 supplies drive electricity to the memory cell array 27, the row address decoder 29, and the sense amp 32.

The control circuit 34 controls interior operation of the NAND flash memory N-k in accordance with a command stored in the command register 23. Due to this, the control circuit 34 writes data in, reads data from, or erases data from the memory cell array 27.

Further, the control circuit 34 has a ready (R) terminal which is connected to the ready signal line B5-k, and outputs a ready signal representing an operational status (ready/busy) of the NAND flash memory N-k to the memory controller CN.

Specifically, in a busy state (for example, during data writing, reading, or erasing), the control circuit 34 sets a level of the ready signal to an inactive level (for example, low level). In a ready state (for example, when data writing, reading, or erasing is finished), the control circuit 34 sets the level of the ready signal to an active level (for example, high level).

The operation logic control circuit 35 has a WE terminal, a RE terminal, an ALE terminal, and a CLE terminal. The WE terminal is connected to the WE signal line of the bus B1. The RE terminal is connected to the RE signal line B4-k. The ALE terminal is connected to the ALE signal line B2-k. The CLE terminal is connected to the CLE signal line B3-k.

The operation logic control circuit 35 controls the operations of the input/output control circuit 22 and the control circuit 34 in accordance with a WE signal, a RE signal, an ALE signal, and a CLE signal supplied from the memory controller CN.

Next, the structure of the memory cell array 27 described above will be explained.

Each memory cell constituting the memory cell array 27 has storage capacity of 1 byte.

The memory cells are logically arranged in a matrix of 131,072 rows and 528 columns. In this case, the NAND flash memory N-k has storage capacity of about 69.2 megabytes.

Figure 3:
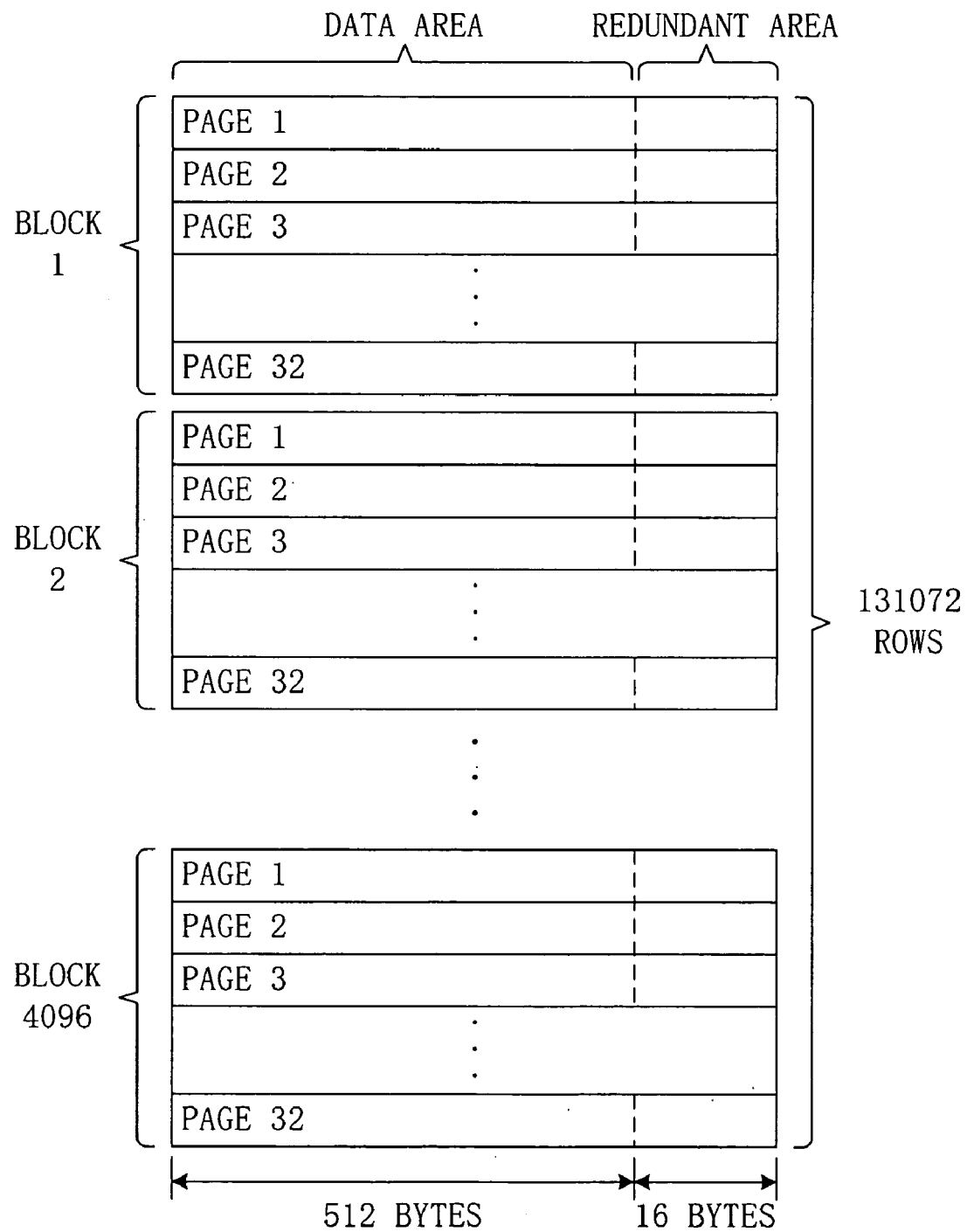
FIG. 3 is a diagram showing a structure of a memory cell array constituting the NAND flash memory shown in FIG. 2.

528 memory cells arranged in each row form a page having storage capacity of 528 bytes, as shown in FIG. 3. That is, the storage area of the memory cell array 27 is formed of 131,072 pages. Memory cells included in each page are given location numbers of 1 to 528 sequentially.

The 131,072 pages are divided from the top by a unit of 32 pages into 4,096 blocks. In this case, each block has storage capacity of 16 kilobytes. The 4,096 blocks are given block addresses of 1 to 4,096 sequentially. Pages included in each block are given page addresses of 1 to 32 sequentially.

As shown in FIG. 3, each page is formed of a data area accounting for 512 bytes from the head, and a redundant area accounting for 16 bytes at the tail.

An objective memory cell to and from which data is written or read is identified by an address (physical address) formed of a bit stream having 26 bits, for example.

The bottom 9 bits of the physical address represent a column address for specifying a column in which the objective memory cell is located, and the remaining top 17 bits represent a row address for specifying a row in which the objective memory cell is located. Column addresses range from 1 to 512, and row addresses range from 1 to 131,072.

Further, of the 17 bits representing the row address, the top 12 bits represent a block address for specifying a block in which the objective memory cell is included, and the remaining bottom 5 bits represent a page address for specifying a page in which the objective memory cell is included. Block addresses range from 1 to 4096, and page addresses range from 1 to 32.

In the data area of each page, various data such as user data used by a user, a device driver executed by an external circuit, etc. are stored.

In the redundant area of each page, there is stored an error check code for confirming that data (user data and device driver) stored in the data area of the corresponding page are not destroyed.

There is also stored an error flag described below in the redundant area of each page. However, an error flag does not have to be stored in all redundant areas. For example, an error flag may be stored in the redundant area of the top page (i.e., a page specified by a page address "1") of each block.

An error flag represents the quality of the block storing this error flag, namely a good block, a congenitally defective block, or a postnatally defective block.

A good block is a block which can store data correctly. A congenitally defective block is a block which is determined by a manufacturer of the NAND flash memory N-k before shipping as incapable of storing data correctly. A postnatally defective block is a block which is determined while the NAND flash memory N-k is used as incapable of storing data correctly.

There may further be stored in the redundant area of each page, a flag representing an attribute of data stored in the data area of the corresponding page.

The value of an error flag indicative of a good block is determined such that it can be changed to another value representing a postnatally defective block by simply writing new data upon the existing data in the redundant area. Therefore, the value of an error flag can be updated without performing the process of erasing data in the redundant area.

For example, an error flag may be formed of a bit stream of 1 byte (8 bits). In this case, it may be set that a good block is represented by seven or more bits each indicative of a value "1", a postnatally defective block is represented by two or more and six or less bits each indicative of a value "1", and a congenitally defective block is represented by seven or more bits each indicative of a value "0".

By setting as described above, an error flag representing a good block can be changed to represent a postnatally defective block by rewriting a value "1" into a value "0".

Next, an operation of the flash memory writing apparatus according to the first embodiment will be explained.

First, an explanation will be given of a case where the memory controller CN performs writing, reading, and erasing of data on the NAND flash memory N-k.

(1) Reading of Data

Figure 4:
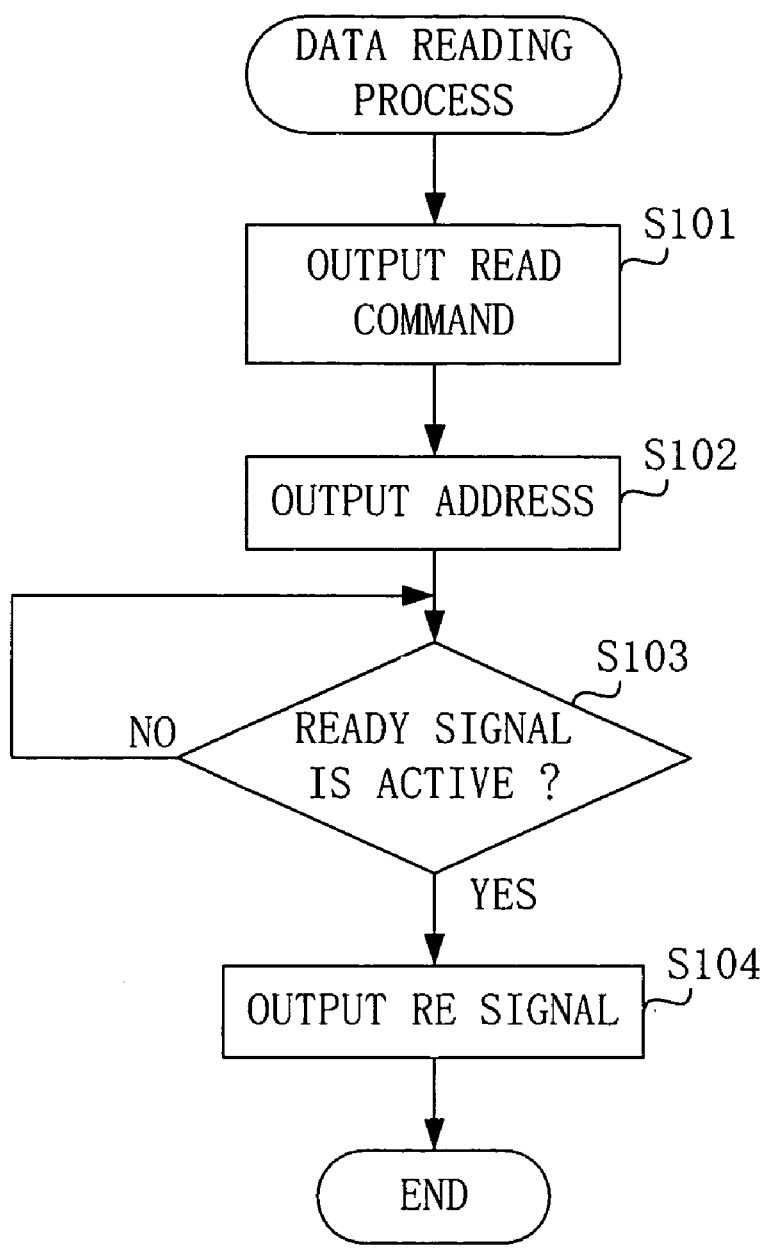
FIG. 4 is a flowchart showing a data reading process performed by a NAND flash memory controller which constitutes the flash memory writing apparatus shown in FIG. 1.

FIG. 4 is a flowchart showing a data reading process performed by the memory controller CN (the control unit 12, to be more specific).

First, the memory controller CN outputs a read command for instructing data reading to the NAND flash memory N-k through the data/address bus of the bus B1 (step S101).

Figure 5:
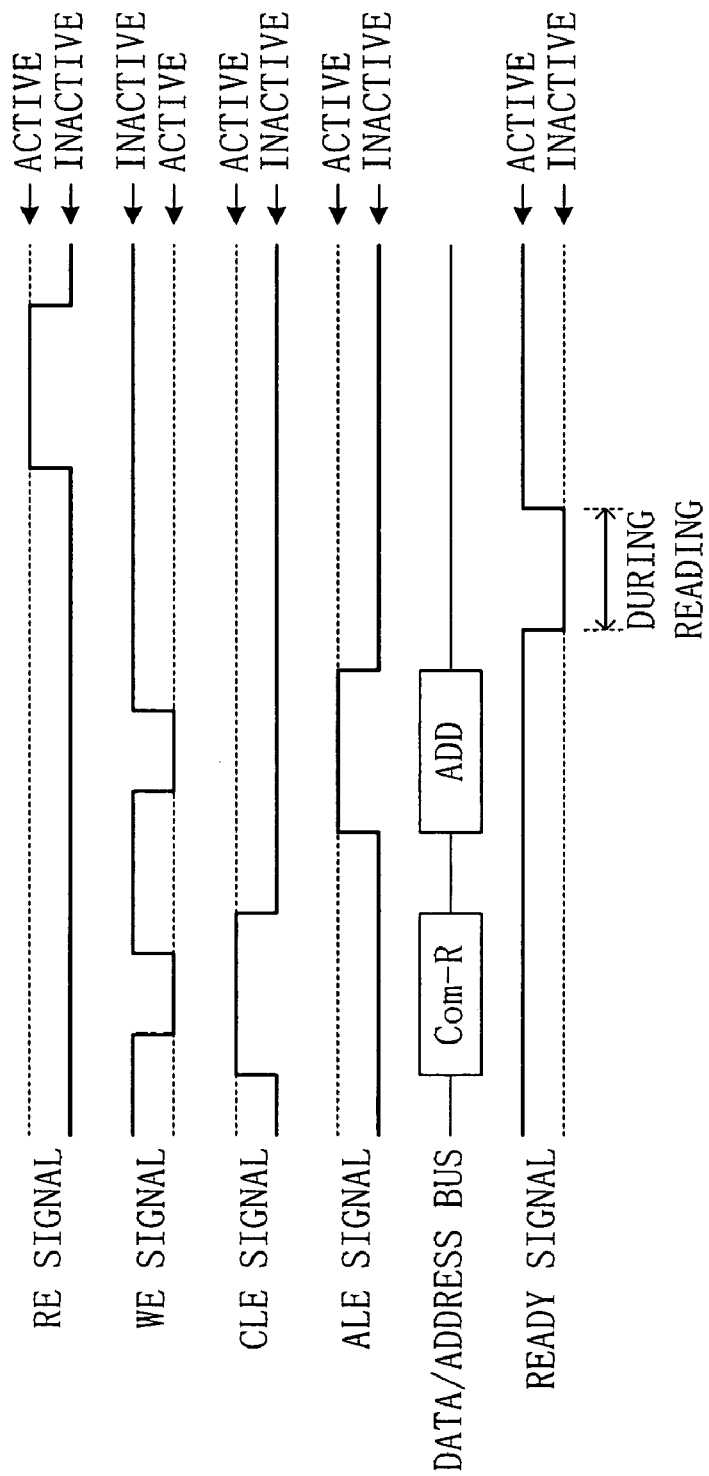
FIG. 5 is a diagram showing signals to be output/received by the NAND flash memory controller in the data reading process shown in FIG. 4.

At this time, the memory controller CN outputs a WE signal having an active level through the WE signal line of the bus B1, and a CLE signal having an active level through the CLE signal line B3-k to the NAND flash memory N-k. Specifically, as shown in FIG. 5, the memory controller CN sets the levels of both of the WE signal and the CLE signal to active levels in synchronization with the timing of outputting the read command (Com-R).

Due to this, the memory controller CN controls the output read command to be acquired in the NAND flash memory N-k.

The NAND flash memory N-k acquires the supplied read command at the timing the levels of the WE signal and CLE signal being supplied from the memory controller CN change to active levels, and stores the read command in the command register 23.

Then, the memory controller CN outputs a physical address representing the location of the head memory cell of a page in which the data to be read is stored to the NAND flash memory N-k (step S102). Specifically, the memory controller CN outputs a bit stream made up of a block address, a page address and a column address as a physical address.

Note that the head memory cell is a memory cell having an address of the smallest value among the values representing addresses of the memory cells storing the data to be read.

At this time, the memory controller CN outputs a WE signal having an active level through the WE signal line of the bus B1, and an ALE signal having an active level through the ALE signal line B2-k to the NAND flash memory N-k. Specifically, as shown in FIG. 5, the memory controller CN sets the levels of the WE signal and the ALE signal to active levels in synchronization with the timing of outputting the physical address (ADD).

Due to this, the memory controller CN controls the output physical address to be acquired in the NAND flash memory N-k.

The NAND flash memory N-k acquires the supplied physical address at the timing the levels of the WE signal and ALE signal being supplied from the memory controller CN become active levels, and stores the acquired physical address in the address register 25.

The NAND flash memory N-k reads data from the head memory cell specified by the physical address stored in the address register 25 and sequentially from the following memory cells in accordance with the read command stored in the command register 23. Specifically, the NAND flash memory N-k reads data in the page where the specified head memory cell is included one memory cell by one (i.e., one byte by one) in the order of the head memory cell to the next.

For example, in a case where data of one page is to be read, the NAND flash memory N-k reads data from the head of the page one byte by one over 528 times.

Then, the NAND flash memory N-k sequentially stores the read data in the data register 24.

In the meantime, the NAND flash memory N-k outputs a ready signal having an inactive level to the memory controller CN through the ready signal line B5-k, as shown in FIG. 5. When reading of data is completed, the NAND flash memory N-k outputs a ready signal having an active level to the memory controller CN through the ready signal line B5-k.

The memory controller CN determines whether or not the level of the ready signal supplied through the ready signal line B5-k has changed from the inactive level to the active level (step S103). Based on this, the memory controller CN determines whether reading of data is completed or not.

In a case where it is determined that the level has not changed to the active level (step S103; NO), the memory controller CN determines that the data is now being read, and performs the process of step S103.

On the contrary, in a case where it is determined that the level has changed to the active level (step S103; YES), the memory controller CN determines that reading of data is completed. Then, as shown in FIG. 5, the memory controller CN outputs a RE signal having an active level to the NAND flash memory N-k through the RE signal line B4-k (step S104). The memory controller CN instructs the NAND flash memory N-k to output the data by setting the level of the RE signal to the active level.

In response to the RE signal having the active level and supplied from the memory controller CN, the NAND flash memory N-k outputs the data stored in the data register 24 to the memory controller CN through the data/address bus 21.

The memory controller CN reads data stored in the memory cell array 27 of the NAND flash memory N-k in the way described above.

(2) Erasing of Data

Figure 6:
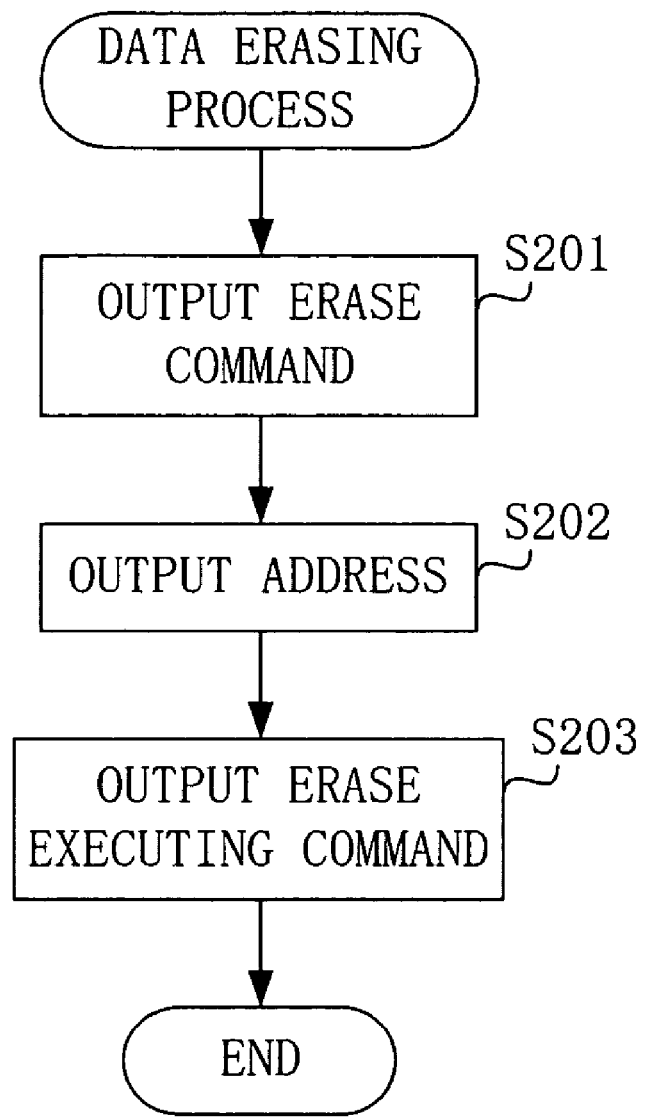
FIG. 6 is a flowchart showing a data erasing process performed by the NAND flash memory controller which constitutes the flash memory writing apparatus shown in FIG. 1.

FIG. 6 is a flowchart showing a data erasing process performed by the memory controller CN (specifically, the control unit 12).

First, the memory controller CN outputs an erase command for instructing erasing of data to the NAND flash memory N-k through the data/address bus of the bus B1 (step S201).

Figure 7:
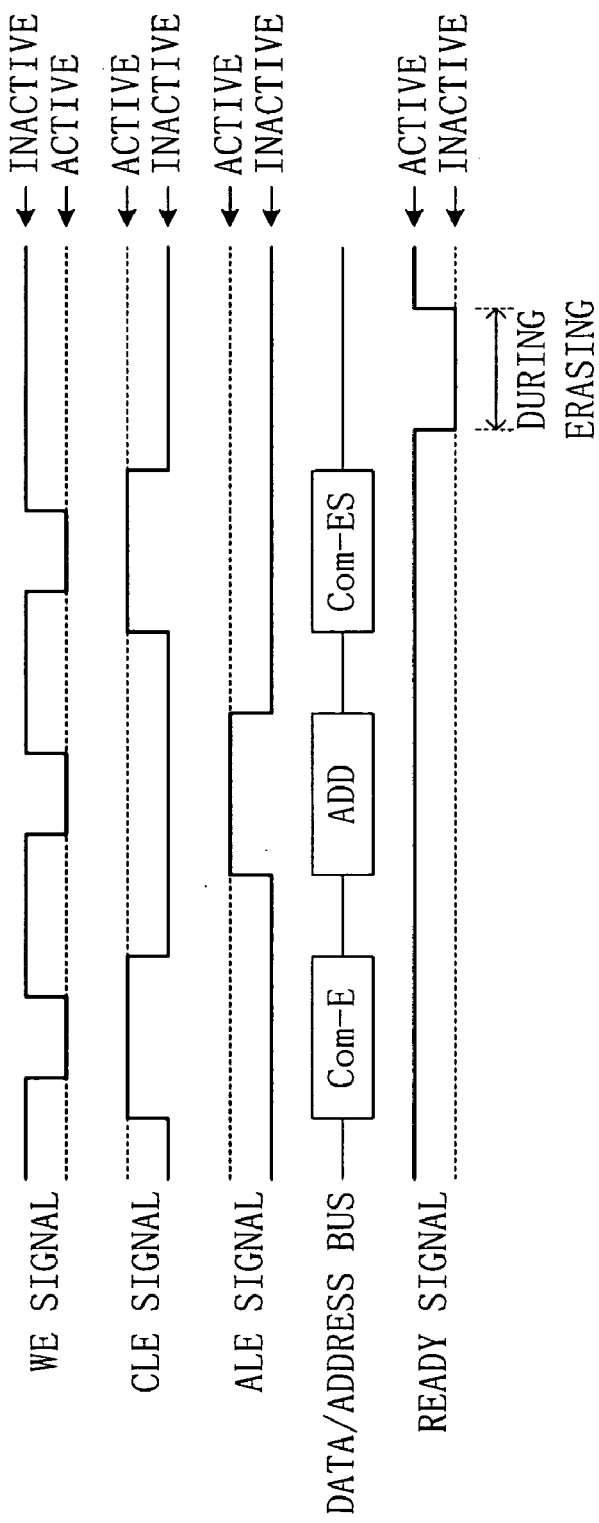
FIG. 7 is a diagram showing signals to be output/received by the NAND flash memory controller in the data erasing process shown in FIG. 6.

At this time, the memory controller CN outputs a WE signal and a CLE signal both having an active level to the NAND flash memory N-k in synchronization with the timing of outputting the erase command (Com-E), as shown in FIG. 7. By doing so, the memory controller CN controls the output erase command to be acquired in the NAND flash memory N-k.

The NAND flash memory N-k acquires the supplied erase command synchronously with the timing at which the levels of the WE signal and CLE signal change to the active level, and stores the erase command in the command register 23.

Then, the memory controller CN outputs a block address for specifying the block storing the data to be erased to the NAND flash memory N-k through the data/address bus of the bus B1 (step S202).

At this time, as shown in FIG. 7, the memory controller CN outputs a WE signal and an ALE signal both having an active level to the NAND flash memory N-k in synchronization with the timing of outputting the block address (ADD). Thus, the memory controller CN controls the output block address to be acquired in the NAND flash memory N-k.

The NAND flash memory N-k acquires the supplied block address at the timing the levels of the WE signal and ALE signal change to the active level, and stores the block address in the address register 25.

Afterwards, the memory controller CN outputs an erase executing command for instructing start of data erasing to the NAND flash memory N-k through the data/address bus of the bus B1 (step S203).

At this time, the memory controller CN outputs a WE signal and a CLE signal both having an active level to the NAND flash memory N-k in synchronization with the timing of outputting the erase executing command (Com-ES), likewise the above case.

In response to the supplied erase executing command at the timing the levels of the WE signal and CLE signal change to the active level, the NAND flash memory N-k erases the data stored in the block specified by the block address stored in the address register 25.

Specifically, the NAND flash memory resets all the memory cells included in the specified block address, i.e., sets the stored values of all the memory cells to "1".

As shown in FIG. 7, while data is being erased, the NAND flash memory N-k sets the level of the ready signal to an inactive level.

In the way described above, the data stored in the NAND flash memory N-k is erased by one block unit.

(3) Writing of Data

Figure 8:
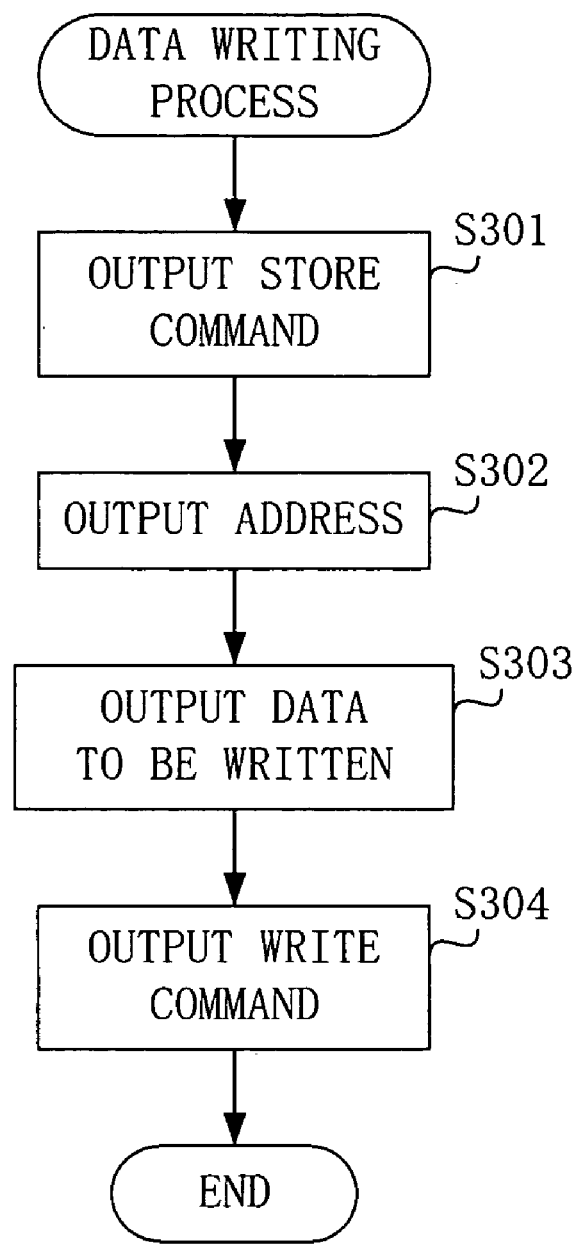
FIG. 8 is a flowchart showing a data writing process performed by the NAND flash memory controller which constitutes the flash memory writing apparatus shown in FIG. 1.

FIG. 8 is a flowchart showing a data writing process performed by the memory controller CN (specifically, the control unit 12).

First, the memory controller CN outputs a store command for instructing storing of data to the NAND flash memory N-k through the data/address bus of the bus B1 (step S301).

Figure 9:
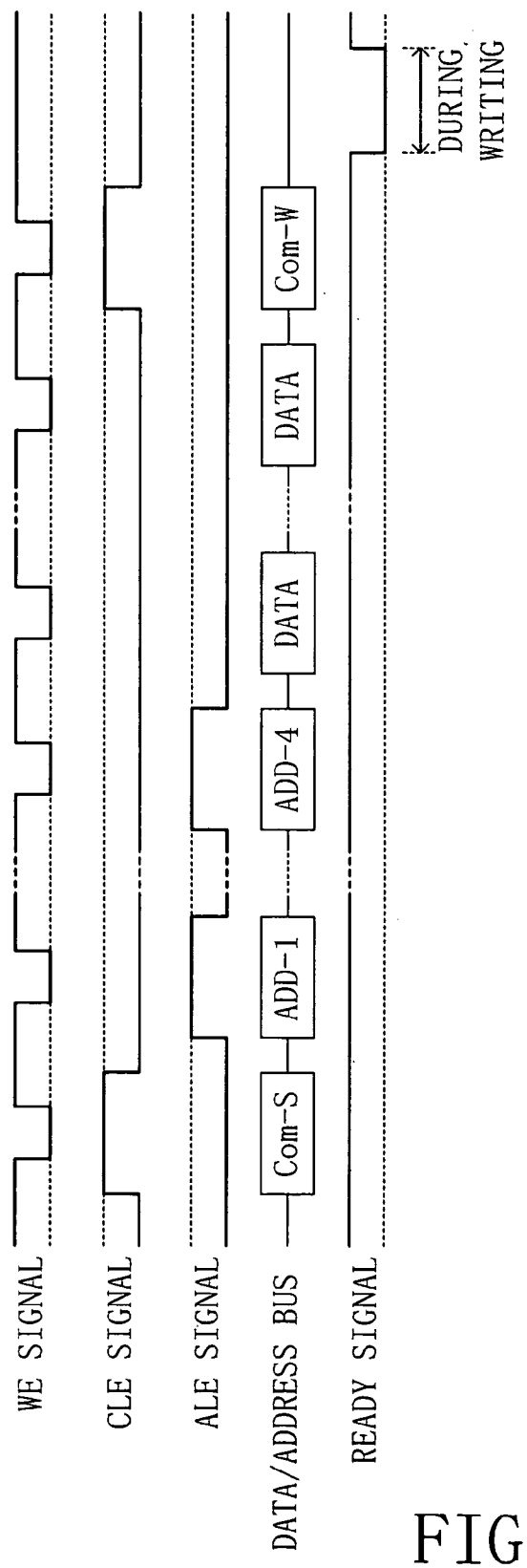
FIG. 9 is a diagram showing signals to be output/received by the NAND flash memory controller in the data writing process shown in FIG. 8.

At this time, the memory controller CN sets the levels of a WE signal and a CLE signal to be output to the NAND flash memory N-k to an active level in synchronization with the timing of outputting the store command (Com-S), as shown in FIG. 9. Thus, the memory controller CN controls the output store command to be acquired in the NAND flash memory N-k.

The NAND flash memory N-k acquires the supplied store command at the timing the levels of the WE signal and CLE signal change to the active level, and stores the store command in the command register 23.

Then, the memory controller CN outputs a physical address indicating the location of the head memory cell in a page in which data is to be written to the NAND flash memory N-k through the data/address bus of the bus B1 (step S302).

Note that a head memory cell is a memory cell having the smallest value of the address among values of addresses of all the memory cells into which data is to be written.

At this time, the memory controller CN divides the physical address into four parts (ADD-1, ADD-2, ADD-3, ADD4) and separately outputs those parts, as shown in FIG. 9. Specifically, the memory controller CN divides the bit stream made up of a block address, a page address, and a column address into four, and then outputs those four parts.

Further, each time a physical address part is output, the memory controller CN a WE signal and an ALE signal both having an active level to the NAND flash memory N-k, likewise the above case.

The NAND flash memory N-k sequentially acquires the addresses (ADD-1 to ADD-4) supplied at the timings the levels of the WE signal and ALE signal change to the active level, and stores the addresses in the address register 25.

Then, the memory controller CN outputs data to be written one byte by one to the NAND flash memory N-k through the data/address bus of the bus B1 (step S303).

At this time, the memory controller CN outputs a WE signal having an active level to the NAND flash memory N-k through the WE signal line of the bus B1, each time data is output, as shown in FIG. 9. Due to this, the memory controller CN controls the output data to be acquired in the NAND flash memory N-k.

The NAND flash memory N-k acquires data supplied through the data/address bus 21 each time the level of the WE signal changes to the active level, and stores the data in the data register 24.

Afterwards, the memory controller CN outputs a write command for instructing start of data writing to the NAND flash memory N-k through the data/address bus of the bus B1 (step S304).

At this time, the memory controller sets the levels of a WE signal and a CLE signal to be output to the NAND flash memory N-k to an active level in synchronization with the timing of outputting the write command (Com-W), likewise the above case.

In response to the supplied write command at the timing the levels of the WE signal and CLE signal change to the active level, the NAND flash memory N-k stores the data to be written now stored in data register 24 in the memory cell array 27.

Specifically, the NAND flash memory N-k stores data in the head memory cell specified by the address stored in the address register 25 and in the following memory cells sequentially.

Meanwhile, the NAND flash memory N-k sets the level of a ready signal to an inactive level, and after writing of data is completed, sets back the level of the ready signal to the active level, as shown in FIG. 9.

In the way described above, data to be written is written in the NAND flash memory N-k.

(4) Writing of Data to NAND Flash Memories N-1 to N-n

Next, explanation will be given of a case where the memory controller CN writes same data in the NAND flash memories N-1 to N-n.

Figure 10A:
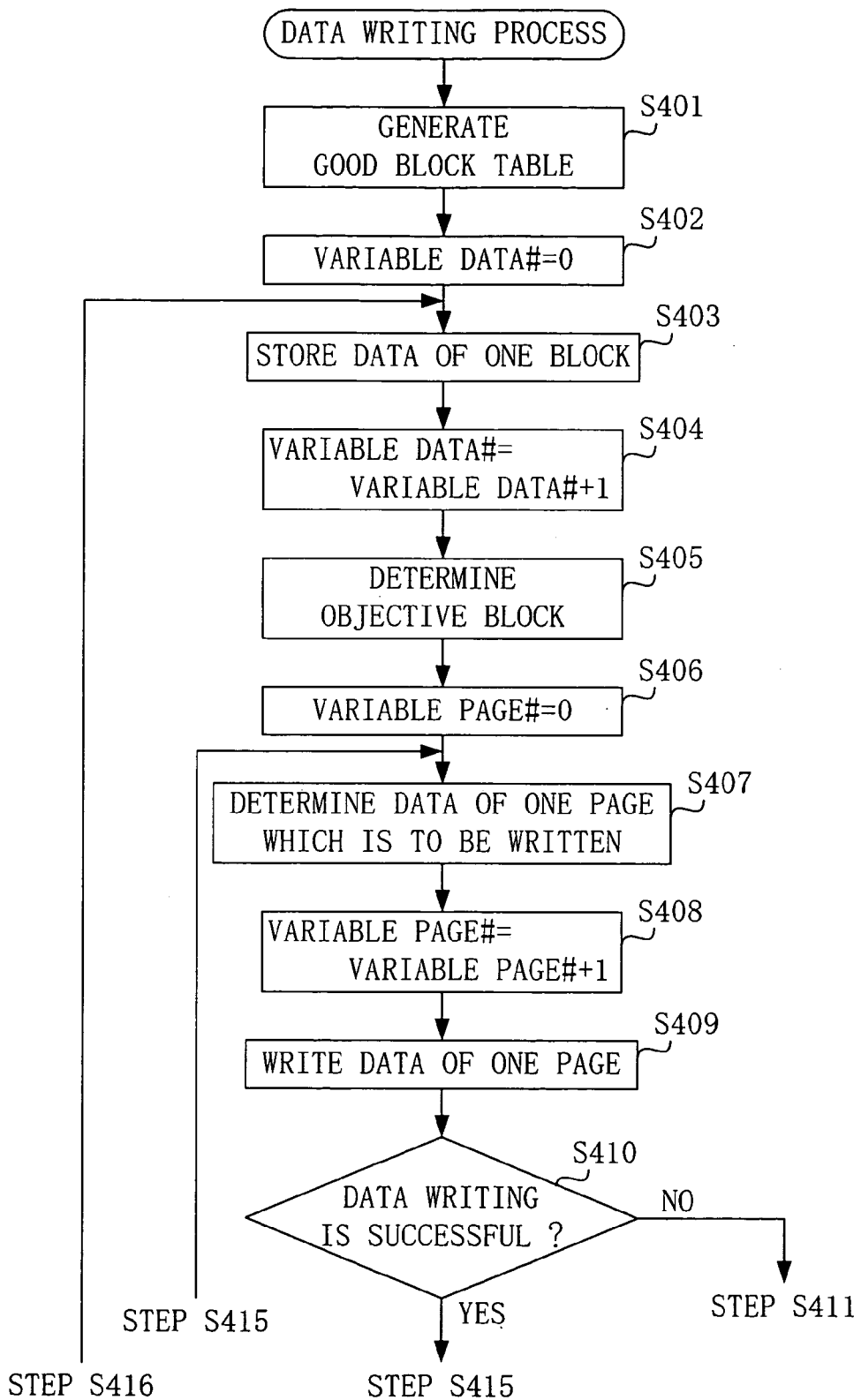
FIGS. 10A and 10B are a flowchart showing a data writing process performed by the AND flash memory controller when writing same data in a plurality of NAND flash memories.
Figure 10B:
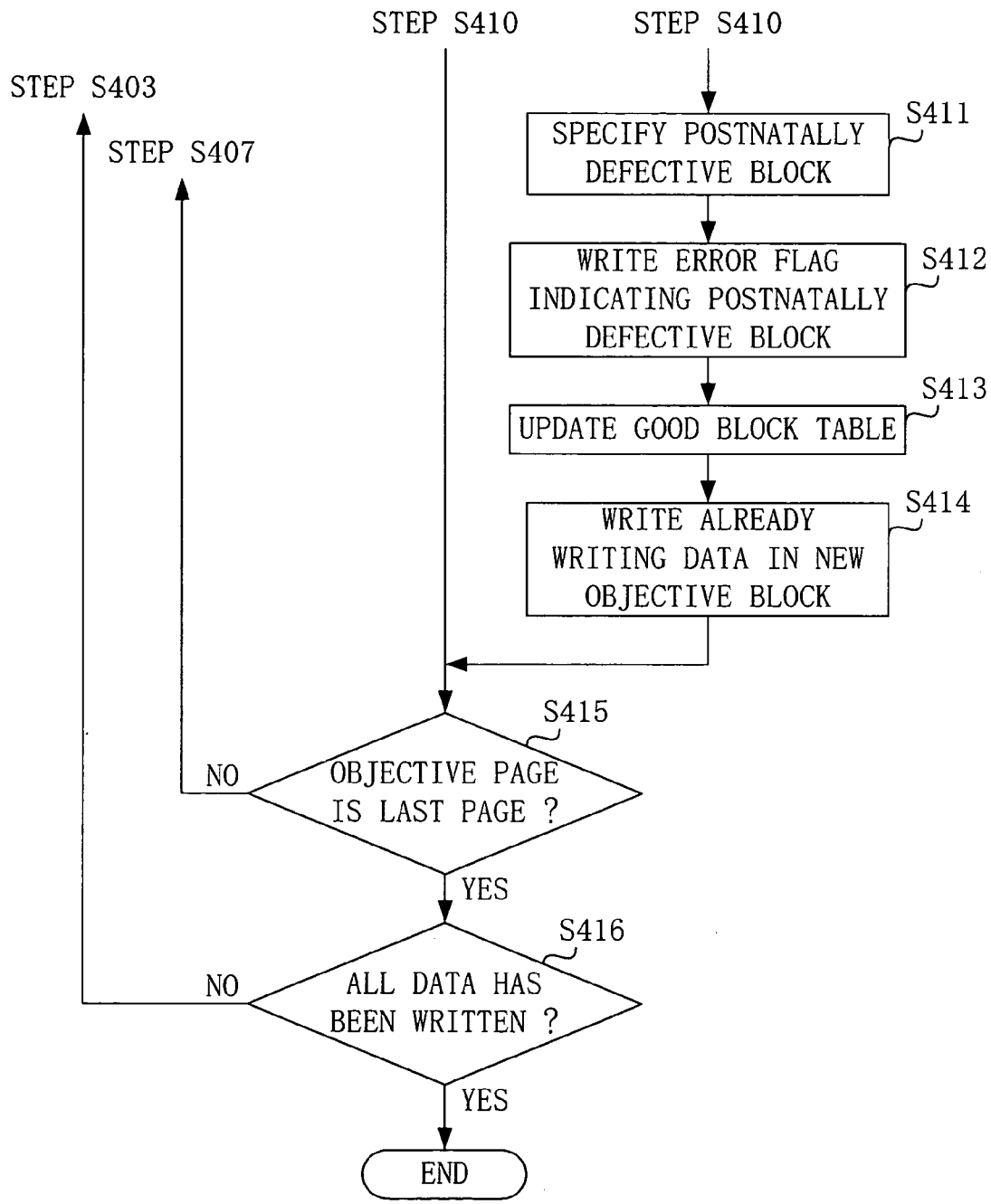

FIGS. 10A and 10B are a flowchart showing a data writing process performed by the memory controller CN (specifically, the control unit 12) when writing same data in the NAND flash memories N-1 to N-n.

First, the memory controller CN generates data (a good block table) representing all good blocks included in the NAND flash memories N-1 to N-n. For example, the good block table represents block addresses of good blocks the NAND flash memories N-1 to N-n respectively include. Then, the memory controller CN stores the generated good block table in the volatile storage 11B (step S401).

Specifically, the memory controller CN reads an error flag stored in each block of the NAND flash memories N-1 to N-n, by following the same way as "(1) Reading of Data" described above. Then, the memory controller CN generates the good block table based on the values represented by the read error flags.

Then, the memory controller CN declares usage of a variable DATA# for determining a block in which data is to be written. Specifically, the memory controller CN secures a storage area for storing the value of the variable DATA# in the volatile storage 11B. Then, the memory controller CN sets the value of the variable DATA# to "0" (step S402).

Next, the memory controller CN secures a storage area for storing data which amounts to one block and which is to be stored in the NAND flash memories N-1 to N-n in the volatile storage 11B. Then, the memory controller CN stores data of one block which is to be written, in the secured storage area (data depositing area) by controlling a non-illustrated circuit for storage controlling (step S403).

Then, the memory controller CN increments the value of the variable DATA# by 1 (step S404).

Then, the memory controller CN refers to the good block table generated in step S401, and determines the objective block in which the data of one block is to be written, for each of the NAND flash memories N-1 to N-n (step S405).

Specifically, in a case where the present value of the variable DATA# is "d", the memory controller CN determines a good block whose block address is the "d-th" smallest of all the good blocks included in each of the NAND flash memories N-1 to N-n, as the objective block.

Then, the memory controller CN declares usage of a variable PAGE# for determining the objective page in which the data is to be written. Specifically, the memory controller CN secures a storage area for storing the value of the variable PAGE# in the volatile storage 11B. Then, the memory controller CN sets the value of the variable PAGE# to "0" (step S406).

Then, the memory controller CN determines data which amounts to one page and is to be written in the objective page from the data stored in the data depositing area (step S407).

Then, the memory controller CN increments the variable PAGE# by 1 (step S408). The objective page in which data is to be written is determined by the variable PAGE#. That is, in a case where the variable PAGE# represents "2", a page having a page address of "2" is determined as the objective page.

Afterwards, the memory controller CN writes the data of one page determined in step S407 in the objective page included in the objective block of each of the NAND flash memories N-1 to N-n (step S409).

Specifically, the memory controller CN writes the data of one page in the NAND flash memories N-1 to N-n likewise "(3) Writing of Data" described above.

Figure 11:
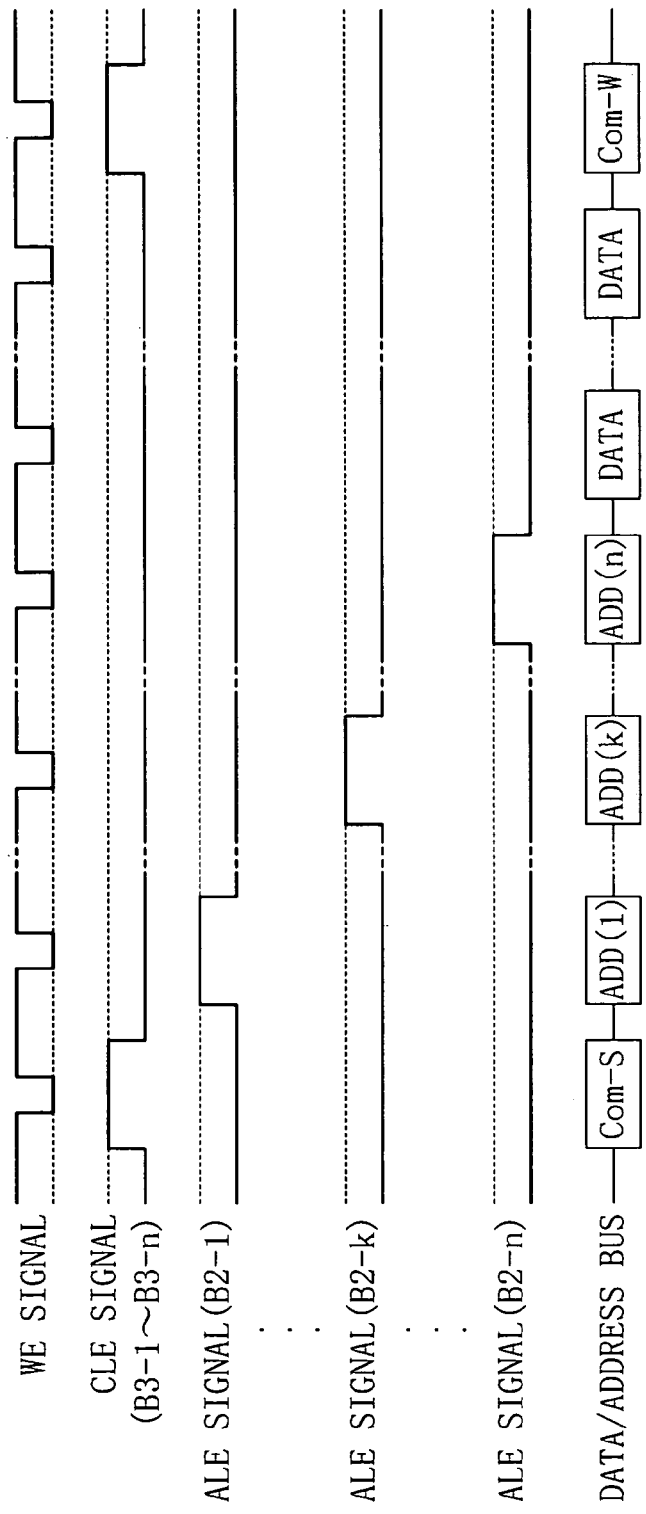
FIG. 11 is a diagram showing signals to be output by the NAND flash memory controller in the data writing process shown in FIGS. 10A and 10B.

First, as shown in FIG. 11, the memory controller CN outputs a store command (Com-S) to the NAND flash memories N-1 to N-n through the data/address bus of the bus B1.

At this time, the memory controller CN outputs a WE signal having an active level through the data/address bus of the bus B1, and a CLE signal having an active level through the CLE signal lines B3-1 to B1-n to the NAND flash memories N-1 to N-n. Thus, the memory controller CN controls the output store command to be acquired in all of the NAND flash memories N-1 to N-n.

Then, the memory controller CN outputs a physical address indicating the location of the head memory cell included in each of the objective pages through the data/address bus of the bus B1.

However, the physical addresses of the head memory cells are not always the same among the NAND flash memories N-1 to N-n. Therefore, as shown in FIG. 11, the memory controller CN outputs the physical addresses (ADD(1) to ADD(n)) of the head memory cells respectively included in the NAND flash memories N-1 to N-n one by one at predetermined intervals.

Further, the memory controller CN outputs a WE signal and an ALE signal both having an active level, each time it outputs a physical address. At this time, as shown in FIG. 11, the memory controller CN switches the outputting routes of the ALE signal having the active level in accordance with the NAND flash memories to receive the physical addresses.

For example, in a case where the physical address ADD(1) of the head memory cell included in the NAND flash memory N-1 is to be output, the memory controller CN outputs the ALE signal having the active level to the NAND flash memory N-1 through the ALE signal line B2-1. In a case where the physical address ADD(k) of the head memory cell included in the NAND flash memory N-k is to be output, the memory controller CN outputs the ALE signal having the active level to the NAND flash memory N-k through the ALE signal line B2-k.

Each of the NAND flash memories N-1 to N-n acquires the supplied physical address at the timing the ALE signal supplied to itself changes to the active level, and stores the physical address in the address register 25.

Although omitted in FIG. 11, the memory controller CN divides one physical address into four, and then outputs them, as described in "(3) Writing of Data" described above.

Afterwards, the memory controller CN outputs the data of one page determined in step S407 one byte by one to the NAND flash memories N-1 to N-n through the data/address bus of the bus B1.

At this time, as shown in FIG. 11, the memory controller CN outputs a WE signal having an active level to the NAND flash memories N-1 to N-n through the data/address bus of the bus B1, each time it outputs data.

Due to this, the NAND flash memories N-1 to N-n acquire the supplied data each time the level of the WE signal changes to the active level, and sequentially store the data in the data register 24.

After outputting the data of one page, the memory controller CN outputs a write command (Com-W) to the NAND flash memories N-1 to N-n through the data/address bus of the bus B1, as shown in FIG. 11.

Also in this case, the memory controller CN outputs a WE signal having an active level through the data/address bus of the bus B1, and a CLE signal having an active level through the CLE signal lines B3-1 to B3-n to the NAND flash memories N-1 to N-n, likewise the above case.

In response to the supplied write command at the timing the levels of the WE signal and CLE signal change to the active level, each of the NAND flash memories N-1 to N-n writes the data of one page stored in the data register 24 in the memory cell array 27.

At this time, each of the NAND flash memories N-1 to N-n writes the data stored in the data register 24 in the head memory cell specified by the physical address stored in the address register 25 and in the following memory cells in this order one byte by one, likewise the above case.

In the meantime, each of the NAND flash memories N-1 to N-n outputs a ready signal having an inactive level to the memory controller CN, likewise the above case.

Further, each of the NAND flash memories N-1 to N-n determines whether or not the data stored in the data register 24 is equal to the data written in the memory cells, while writing the data. Based on this, each of the NAND flash memories N-1 to N-n determines whether or not the data has been written correctly in a predetermined period of time, or in a predetermined number of times.

Then, each of the NAND flash memories N-1 to N-n stores the determination result in the status register 26. Specifically, each of the NAND flash memories N-1 to N-n stores a status bit representing that writing is successful (Pass) in the status register 26 in a case where it is determined that the data has been written correctly. Each of the NAND flash memories N-1 to N-n stores a status bit representing that writing is unsuccessful (Fail) in the status register 26 in a case where it is determined that the data has not been written correctly.

On the other hand, the memory controller CN determines whether or not writing of data has been completed, based on the level of the ready signal supplied from each of the NAND flash memories N-1 to N-n, likewise the above case.

Then, when it is determined that writing of data has been completed, the memory controller CN determines whether or not writing of data is successful in all of the NAND flash memories N-1 to N-n (step S410).

Specifically, the memory controller CN outputs a status read command for instructing output of the determination result stored in the status register 26 to the NAND flash memories N-1 to N-n through the data/address bus of the bus B1. Then, the memory controller CN outputs a RE signal having an active level to the NAND flash memories N-1 to N-n through the RE signal lines B4-1 to B4-n.

When supplied with the status read command and the RE signal having the active level, each of the NAND flash memories N-1 to N-n outputs the value of the status bit stored in the status register 26, to the memory controller CN.

The memory controller CN determines whether or not there is any NAND flash memory that has failed in writing the data, based on the supplied values of the status bits. Due to this, the memory controller CN determines whether or not writing of data is successful in all of the NAND flash memories N-1 to N-n.

When it is determined that writing of data is not successful (step S410; NO), the memory controller CN specifies the NAND flash memory that has failed in writing the data based on the supplied values of the status bits. Then, the memory controller CN specifies the objective block included in the NAND flash memory that has failed in writing of the data, as a postnatally defective block (step S411).

Then, the memory controller CN writes an error flag indicating a postnatally defective block, in the redundant area of each page or the top page included in the specified postnatally defective block (step S412).

Then, the memory controller CN updates (or regenerates) the above described good block table (step S413). Therefore, information regarding the specified postnatally defective block is deleted from the good block table.

Afterwards, the memory controller CN refers to the updated good block table, and sets a block whose block address is the smallest second to that of the postnatally defective block as an objective block. Then, the memory controller CN writes the data which should have already been written in the newly set objective block (step S414), and performs a later-described process of step S415.

On the contrary, in a case where it is determined in step S410 that writing of data is successful in all of the NAND flash memories N-1 to N-n (step S410; YES), the memory controller CN determines whether or not the objective page is the last page of the objective block (step S415). Specifically, the memory controller CN determines whether or not the value of the variable PAGE# is equal to the number of pages included in one block.

In a case where it is determined that the objective page is not the last page (step S415; NO), the memory controller CN moves to the process of step S407.

On the contrary, when it is determined that the objective page is the last page (step S415; YES), the memory controller CN determines whether or not all the data to be written has been written (step S416).

When it is determined that not all the data has been written (step S416; NO), the memory controller CN moves to the process of step S403. Then, the memory controller CN writes the data yet unwritten in the NAND flash memories N-1 to N-n.

On the contrary, when it is determined that all the data has been written (step S416; YES), the memory controller CN ends the data writing process.

As described above, since writing of data is performed while whether such data is written successfully is determined, the same data can be efficiently written in the NAND flash memories N-1 to N-n.

Second Embodiment

Next, a flash memory writing apparatus according to a second embodiment of the present invention will now be explained with reference to the drawings.

Figure 12:
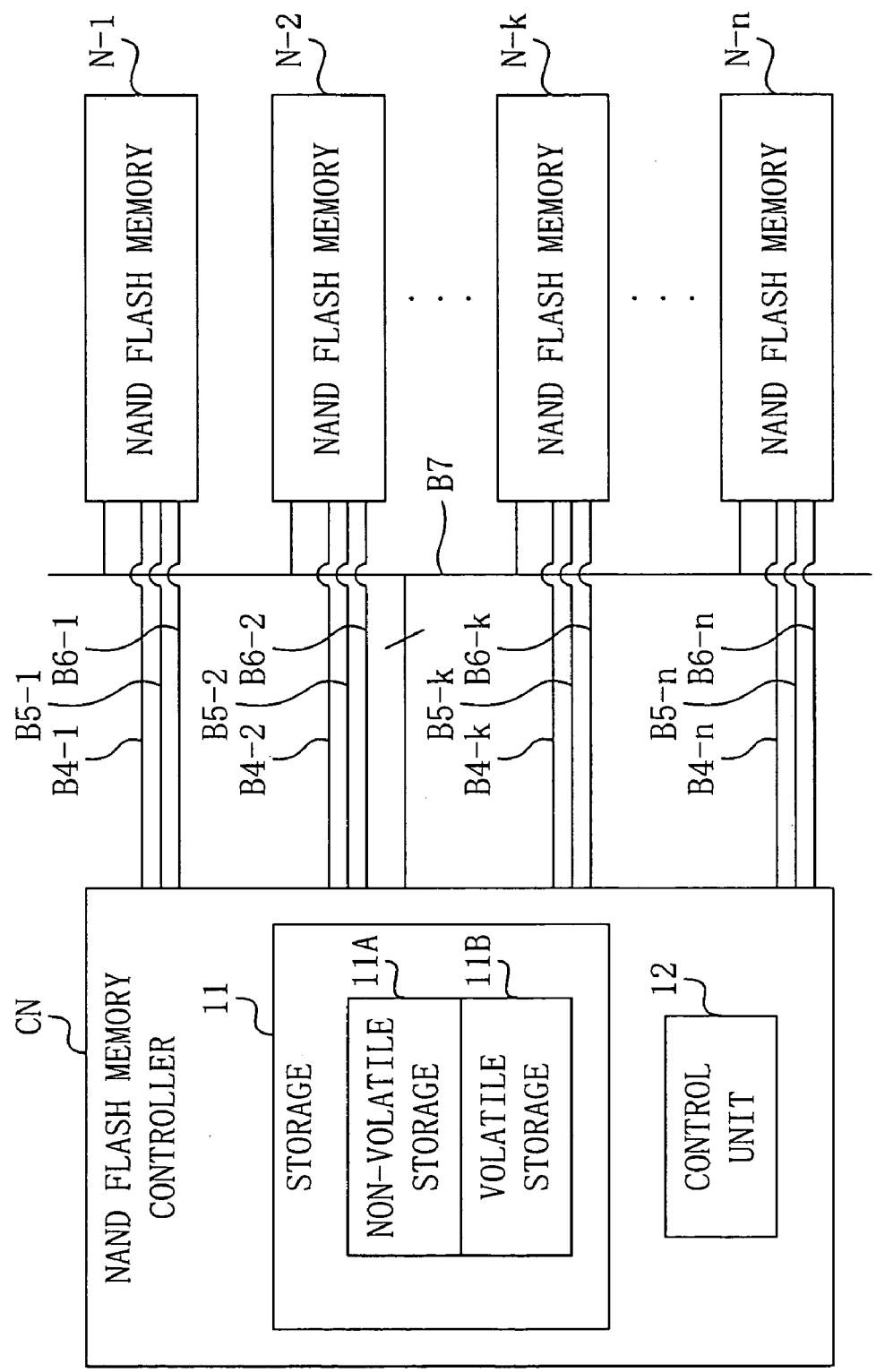
FIG. 12 is a diagram showing a structure of a flash memory writing apparatus according to a second embodiment.

As shown in FIG. 12, the flash memory writing apparatus according to the second embodiment comprises a NAND flash memory controller (memory controller) CN, read enable (RE) signal lines B4-1 to B4-n, ready (R) signal lines B5-1 to B5-n, write enable (WE) signal lines B6-1 to B6-n, and a bus B7.

The RE signal line B4-k (k is an integer equal to or greater than 1 and equal to or smaller than n) is connected to a RE terminal of a NAND flash memory N-k.

The ready signal line B5-k is connected to a ready terminal of the NAND flash memory N-k.

The WE signal line B6-k is connected to a WE terminal of the NAND flash memory N-k.

The bus B7 comprises a data/address bus, an address latch enable (ALE) signal line, and a command latch enable (CLE) signal line.

The data/address bus is connected to data/address buses 21 of NAND flash memories N-1 to N-n.

The ALE signal line is connected to ALE terminals of the NAND flash memories N-1 to N-n.

The CLE signal line is connected to CLE terminals of the NAND flash memories N-1 to N-n.

The memory controller CN is connected equally to the NAND flash memories N-1 to N-n through the bus B7.

Further, the memory controller CN is connected separately to the NAND flash memories N-1 to N-n through the RE signal lines B4-1 to B4-n, the ready signal lines B5-1 to B5-n, and the WE signal lines B6-1 to B6-n.

The structure of the flash memory writing apparatus is substantially the same as that of the first embodiment, except the above described points.

Next, operations of the memory controller CN when writing same data in the NAND flash memories N-1 to N-n will be explained.

Figure 13:
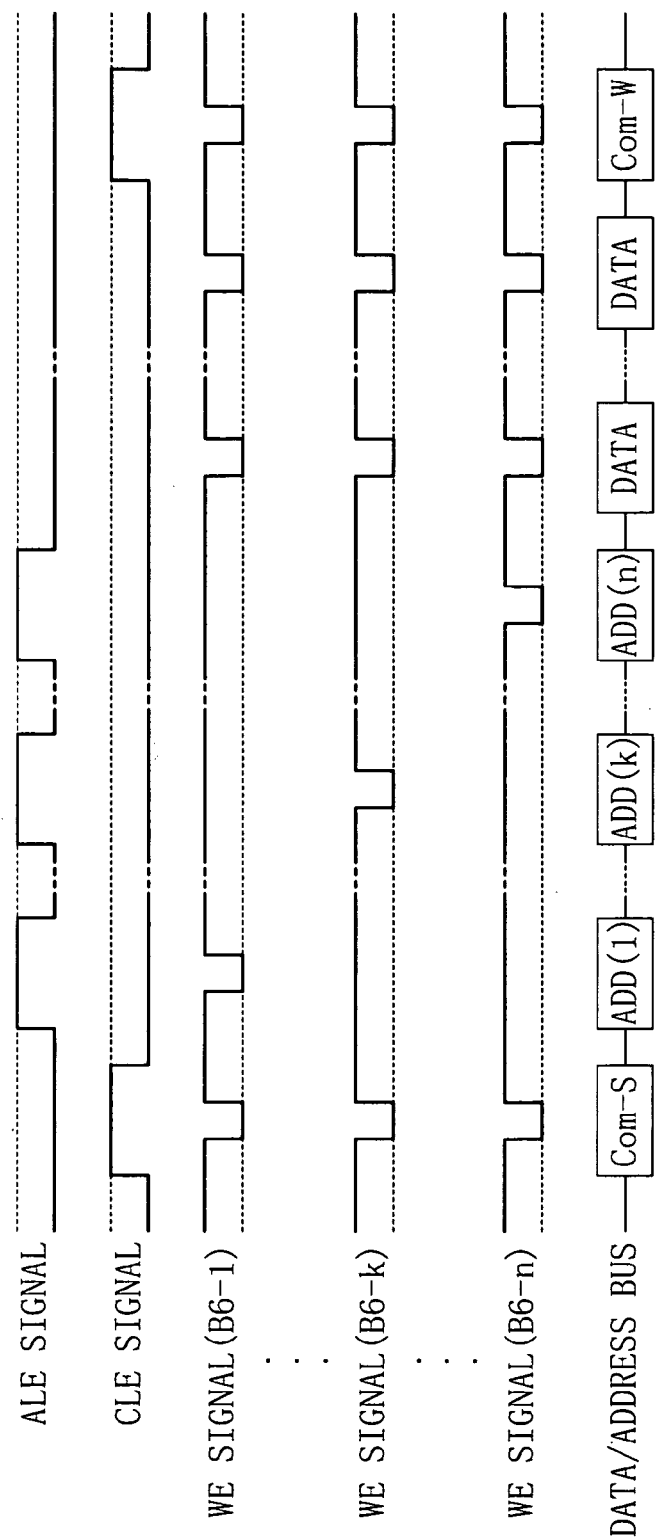
FIG. 13 is a diagram showing signals to be output by a NAND flash memory controller which constitutes the flash memory writing apparatus shown in FIG. 12, when writing same data in a plurality of NAND flash memories.

As shown in FIG. 13, the memory controller CN outputs a store command (Com-S) first.

At this time, the memory controller CN outputs a CLE signal having an active level through the CLE signal line of the bus B7, and a WE signal having an active level through the WE signal lines B6-1 to B6-n to the NAND flash memories N-1 to N-n. Thus, the memory controller CN controls the output store command to be acquired in all of the NAND flash memories N-1 to N-n.

Then, the memory controller CN outputs physical addresses indicating the locations of the head memory cells included in the objective pages in which data is to be written, through the data/address bus of the bus B7.

At this time, the memory controller CN outputs the physical addresses (ADD(1) to ADD(n)) of the head memory cells included in the NAND flash memories N-1 to N-n one by one at predetermined intervals, likewise the first embodiment.

Further, the memory controller CN outputs a WE signal and an ALE signal both having an active level to the NAND flash memories N-1 to N-n, each time it outputs a physical address. At this time, as shown in FIG. 13, the memory controller CN switches the outputting routes of the WE signal having the active level in accordance with the NANd flash memories N-1 to N-n to receive the physical address.

For example, in a case where the physical address ADD(1) of the head memory cell included in the NAND flash memory N-1 is to be output, the memory controller CN outputs the WE signal having the active level to the NAND flash memory N-1 through the WE signal line B6-1. In a case where the physical address ADD(k) of the head memory cell included in the NAND flash memory N-k is to be output, the memory controller CN outputs the WE signal having the active level to the NAND flash memory N-k through the WE signal line B6-k.

Each of the NAND flash memories N-1 to N-n acquires the supplied physical address at the timing the level of the WE signal supplied thereto changes to the active level, and stores the physical address in the address register 25.

Although omitted in FIG. 13, the memory controller CN outputs one physical address over four times, likewise the first embodiment.

Afterwards, the memory controller CN outputs data to be written, to the NAND flash memories N-1 to N-n through the data/address bus of the bus B7 one byte by one.

At this time, the memory controller CN outputs a WE signal having an active level to the NAND flash memories N-1 to N-n through the WE signal lines B6-1 to B6-n, each time it outputs data, as shown in FIG. 13.

Thus, each of the NAND flash memories N-1 to N-n acquires the supplied data at the timing the level of the WE signal changes to the active level, and stores the acquired data in the data register 24.

After outputting the data to be written, the memory controller CN outputs a write command (Com-W) to the NAND flash memories N-1 to N-n through the data/address bus of the bus B7, as shown in FIG. 13.

Also in this case, the memory controller CN outputs a CLE signal having an active level through the CLE signal line of the bus B7, and a WE signal having an active level through the WE signal lines B6-1 to B6-n to the NAND flash memories N-1 to N-n, likewise the above.

Each of the NAND flash memories N-1 to N-n responds to the supplied write command at the timing the levels of the WE signal and CLE signal change to the active level, and writes the data stored in the data register 24 in the memory cell array 27.

Operations other than the above described are substantially the same as those of the first embodiment.

Also in the way described above, same data can be written efficiently in the NAND flash memories N-1 to N-n.

According to the first and second embodiments, when outputting a same physical address to a plurality of NAND flash memories, the memory controller CN may control this physical address to be acquired in the plurality of NAND flash memories substantially at the same timing.

For example, when outputting a same physical address A1 to the NAND flash memories N-1 and N-n, the memory controller CN may control the physical address Al to be acquired in both of the NAND flash memories N-1 and N-n at substantially the same timing.

Figure 14A:
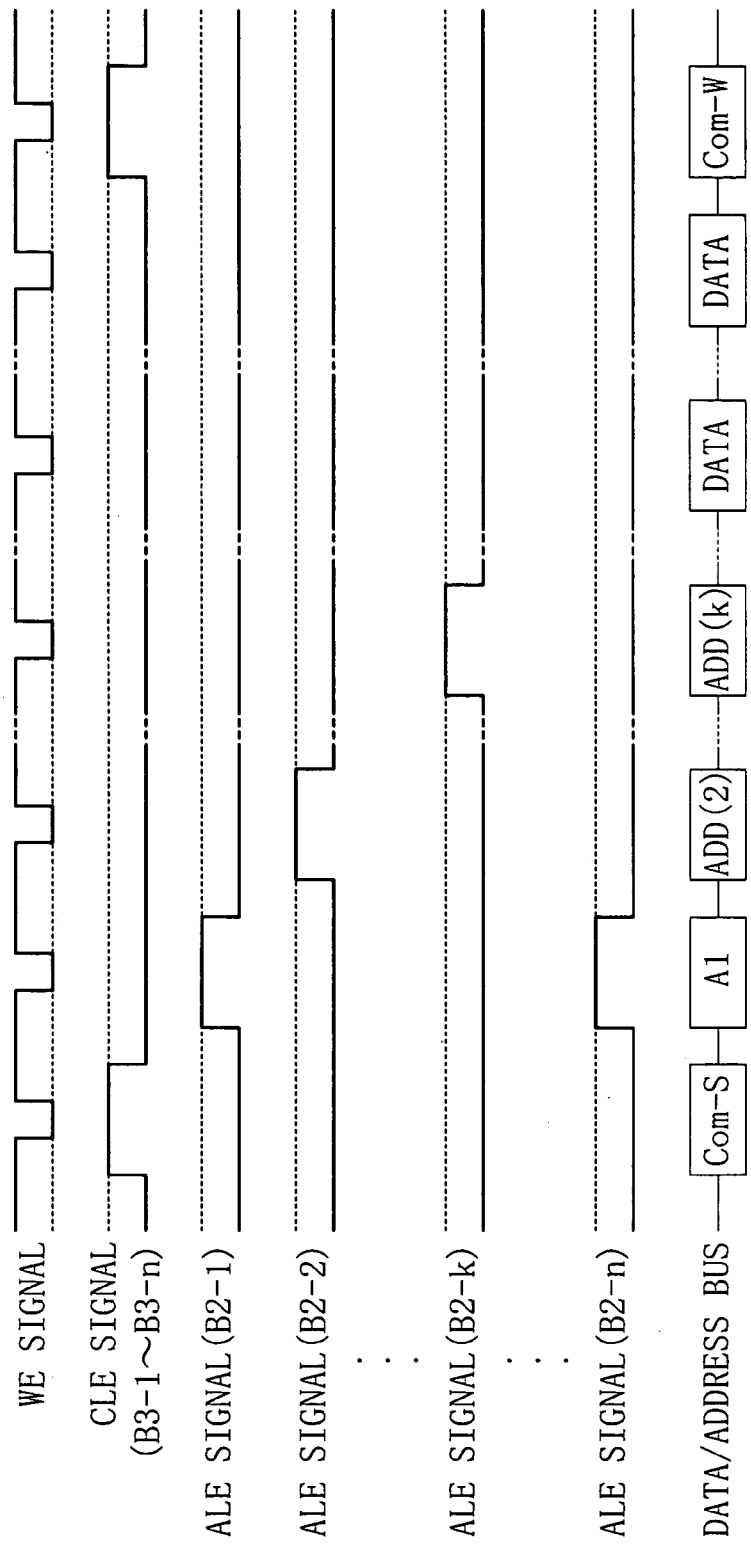
FIGS. 14A and 14B respectively show examples of methods by which a NAND flash memory controller controls a same address to be acquired in a plurality of NAND flash memories.

Specifically, the memory controller CN according to the first embodiment may output an ALE signal having an active level to both of the NAND flash memories N-1 and N-n through the ALE signal lines B2-1 and B2-n at the timing of outputting the physical address A1, as shown in FIG. 14A.

Figure 14B:
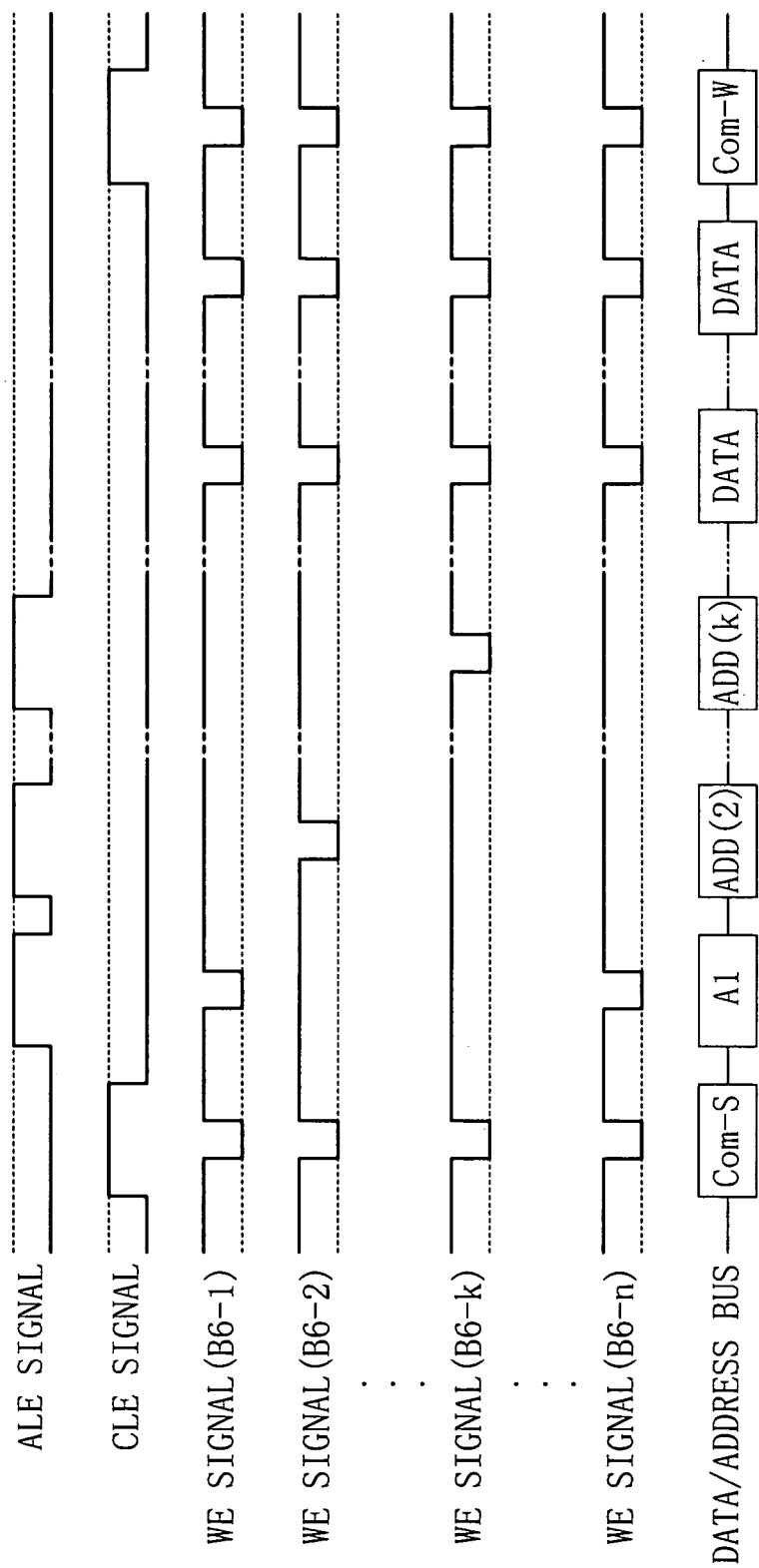

Or, the memory controller CN according to the second embodiment may output a WE signal having an active level to both of the NAND flash memories N-1 and N-n through the WE signal lines B6-1 and B6-n at the timing of outputting the physical address A1, as shown in FIG. 14B.

Due to this, the NAND flash memories N-1 and N-n acquire the same physical address A1 at the same timing. As a result, the period of time for supplying the physical address can be shortened, and thus writing of data can be more efficiently performed.

Further in a case where only a part of a physical address (for example, the bottom 8 bits in the bit stream constituting a physical address) is shared between a plurality of NAND flash memories, the memory controller CN may control the shared part of the physical address to be acquired in the plurality of NAND flash memories substantially at the same timing by performing the same operations as described above. By this control, the period of time for supplying the physical address can also be shortened, and writing of data can be more efficiently performed.

Further, after step S414 of the data writing process shown in FIGS. 10A and 10B, the memory controller CN may again determine whether or not writing of data is successful. Then, in a case where it is determined that writing of data is unsuccessful, the memory controller CN may perform the processes of steps S411 to S414. Due to this, writing of data can be performed even in a case where postnatally defective blocks are consecutively discovered.

And in a case where it is determined in step S416 of the data writing process shown in FIGS. 10A and 10B that not all the data has been written, the memory controller CN may determine whether or not any block in which data can be stored remains in each of the NAND flash memories N-1 to N-n. Specifically, the memory controller CN may refer to the good block table, and determine whether or not there is any good block whose block address is the second smallest. Then, in a case where there is any NAND flash memory which has no block left in which data can be written, the memory controller CN may suspend the data writing process. Or, the memory controller CN may suspend the data writing process for only the NAND flash memory which has no block left in which data can be written.

Further, in the data writing process shown in FIGS. 10A and 10B, the memory controller CN may perform the processes of steps s409 to S414 separately for the data area constituting each page, and the redundant area constituting each page. By doing so, after determining whether or not writing of data in the data area is successful, the memory controller CN can write data in the redundant area regardless of the determination result. In other words, regardless of whether the objective block is a postnatally defective block or not, data can be written in the redundant area of each page included in the objective block. Therefore, a special flag, etc. can be written in the redundant area.

Furthermore, the initial value of the variable DATA# to be set in step S402 of the data writing process shown in FIGS. 10A and 10B may not be "0".

And in steps S404 and 408 of the data writing process shown in FIGS. 10A and 10B, the values of the variable DATA# and variable PAGE# may be decremented, instead of being incremented.

Still further, the number of blocks included in the memory cell array 27, the number of pages included in one block, and the number of memory cells constituting the memory cell arrays are not limited to the numbers described in the above embodiments, but are arbitrary.

And when writing data, the memory controller CN divides one physical address into four parts, and then outputs those parts separately, as described above. However, the memory controller CN may output one physical address without dividing it, or may output one physical address after dividing it into two, three, or more than four.

And the 4096 blocks may be classified into a plurality of groups (zones). Zone addresses may be given to the plurality of zones serially from the top zone, and block addresses may be given to the plurality of included blocks serially in each zone. In this case, the objective block to be processed may be specified by a zone address and a block address.

Furthermore, according to the first and second embodiments, the data to be written in the NAND flash memories N-1 to N-n is such data as being transmitted one byte by one, i.e., data having a so-called byte serial structure. However, data to be written in the NAND flash memories N-1 to N-n may be serial data to be transmitted one bit by one.

Yet further, the memory controller CN may obtain data to be written in the NAND flash memories N-1 to N-n by following an operation of an operator, by reading from a recording medium installed thereto, or by acquiring from foreign system through a communication line.

In this case, the memory controller CN comprises a keyboard, a recording medium driver for reading data from a recording medium, and an input unit including a serial port, etc, for communicating with a foreign system. The recording medium driver may be a flexible disk drive device, or a MO (Magneto Optical disk) drive device, for example.

Further, each of the NAND flash memories N-1 to N-n may be constituted by an AND flash memory (for example, "HN29W12811" (HITACHI)).

Further, each of the NAND flash memories N-1 to N-n may be constituted by a flash memory which is switched between an enable state and a disable state in accordance with a chip enable (CE) signal. In this case, the memory controller CN may control a physical address to be acquired in each of the NAND flash memories N-1 to N-n using a CE signal instead of an ALE signal.

The NAND flash memories N-1 to N-n may be flash memories which can be controlled to acquire a physical address only by a WE signal. In this case, the memory controller CN may control a physical address to be acquired in each of the NAND flash memories N-1 to N-n without using an ALE signal, but using a WE signal.

The structure of the flash memory writing apparatus according to the embodiments of the present invention can be applied in various ways within the scope of the meaning of the present invention.

The embodiments of the present invention have been explained as above. The data writing apparatus according to the present invention can be realized by an ordinary computer system, not by a specially-made system. For example, the flash memory writing apparatus for performing the above processes can be structured by installing a program for executing the above described operations of the memory controller CN in a computer to which NAND or AND flash memories are connected.

Such a program may be installed in a computer from a recording medium such as a flexible disk, a CD-ROM, etc.

Such a program may be posted on a bulletin board (BBS) on a communication network, and may be distributed through a communication line.

Or, such a program may be transmitted on a carrier wave (modulated wave) which is modulated by a signal representing this program. An apparatus receiving this modulated wave may demodulate the modulated wave, and thus restore the program.

The program, which is installed in a computer, is executed under the control of an OS (Operating System) likewise other application programs. Due to this, the processes shown in the first and second embodiments can be performed.

In a case where the OS shares some parts of the processes, or the OS constitutes a part of a component included in the present invention, a program from which those parts are excluded may be stored in a recording medium. Also in this case, according to the present invention, a program for realizing each function and step performed by a computer is stored in the recording medium.

This application is based on Japanese Patent Application No. 2001-301789 filed on Sep. 28, 2001 and including specification, claims, drawings and summary. The disclosure of the above Japanese Patent Application is incorporated herein by reference in its entirety.

The invention claimed is:

1. A data writing apparatus for writing same data in parallel in a plurality of storage devices comprising flash memories, wherein:

each of said plurality of storage devices comprises:

a plurality of memory blocks which store data and error information representing whether or not each of said plurality of memory blocks is a good block which can store data correctly;

an error information supplier which supplies said data writing apparatus with the error information stored in said plurality of memory blocks; and a data writer which, in response to an instruction of said data writing apparatus, writes data in a memory block designated by said data writing apparatus, and said data writing apparatus comprises:

a block designator which designates a memory block to which said same data is to be written for each of said plurality of storage devices, based on the error information supplied from said error information supplier;

a data supplier which supplies said plurality of storage devices with said same data to be written; and a writing instructor which instructs said plurality of storage devices to write said same data supplied by said data supplier in the memory blocks designated by said block designator in parallel.

2. The data writing apparatus according to claim 1, wherein:

each of said plurality of storage devices further comprises:

a first determiner which determines whether or not the data has been written correctly; and a result supplier which supplies said data writing apparatus with a determination result of said first determiner, said data writing apparatus further comprises:

a second determiner which determines whether or not there is any defective device among said plurality of storage devices to which the data has not been written correctly, based on the determination result supplied from said result supplier; and a defective device identifier which in a case where said second determiner determines that there is any defective device, identifies the defective device, said block designator designates another memory block to which the data is to be written, in the defective device identified by said defective device identifier based on the error information, and said writing instructor instructs the defective device to write the data supplied by said data supplier in the another memory block designated by said block designator.

3. The data writing apparatus according to claim 2, wherein said block designator comprises:

a table generator which generates a good block table listing good blocks included in each of said plurality of storage devices, based on the error information supplied from said error information supplier; and a block determiner which determines a memory block to which the data is to be written, based on the good block table.

4. The data writing apparatus according to claim 2, wherein said data writing apparatus further comprises an information updating unit which, in a case where said second determiner determines that there is any defective device, updates the error information stored in said plurality of memory blocks included in the defective device.

5. The data writing apparatus according to claim 2, further comprising:

a third determiner which determines whether or not there is any storage device which has no memory block left in which data can be written; and a suspension unit which suspends data writing, in a case where said third determiner determines that there is any storage device which has no memory block left in which data can be written.

6. The data writing apparatus according to claim 2, wherein:
  each of said plurality of memory blocks is allotted an address; and
  said block designator designates a memory block to which data is to be written, by outputting an address allotted to the memory block to which data is to be written.

7. The data writing apparatus according to claim 6, wherein
  said block designator divides the address into a plurality of parts, and outputs the plurality of parts one by one.

8. The data writing apparatus according to claim 6, wherein
  in a case where at least a part of the address to be output is common to at least two of said plurality of storage devices, said block designator outputs the common part of the address to said at least two storage devices simultaneously.

9. The data writing apparatus according to claim 2, wherein
  each of said plurality of storage devices is constituted by a NAND type flash memory.

10. The data writing apparatus according to claim 2, wherein
  each of said plurality of storage devices is constituted by an AND type flash memory.

11. A data writing method of writing same data in parallel in a plurality of storage devices comprising flash memories, wherein:
  each of said plurality of storage devices comprises:
    a plurality of memory blocks which store data and error information representing whether or not each of said plurality of memory blocks is a good block which can store data correctly; and
    a data writer which writes data in said plurality of memory blocks, and
  said data writing method comprises:
    a block designating step of designating a memory block in which said same data is to be written for each of said plurality of storage devices, based on the error information stored in said plurality of memory blocks;
    a data supplying step of commonly supplying said plurality of storage devices with said same data to be written; and
    a writing step of commonly instructing said plurality of storage devices to write said same data supplied in said data supplying step in the memory block designated in said block designating step.

12. A program for controlling a computer to function as a data writing apparatus which writes same data in a plurality of storage devices in parallel each comprising: a plurality of memory blocks which store data and error information representing whether or not each of said plurality of memory blocks is a good block which can store data correctly; an error information supplier which supplies the error information stored in said plurality of memory blocks; and a data writer which writes data in said plurality of memory blocks,
  said data writing apparatus comprising:
    a block determiner which determines a memory block to which data is to be written for each of said plurality of storage device, based on the error information supplied from said error information supplier;
    a data supplier which commonly supplies said plurality of storage devices with said same data to be written; and
    a writer which, by controlling, in parallel, each of said plurality of storage devices, writes the data supplied by said data supplier in the memory block determined by said block determiner.

* * * * *